(12) United States Patent
Kwon et al.

(10) Patent No.: US 11,586,289 B2
(45) Date of Patent: Feb. 21, 2023

(54) INFORMATION OUTPUT DEVICE

(71) Applicants: DOT INCORPORATION, Seoul (KR); KOREA ADVANCED INSTITUTE OF SCIENCE AND TECHNOLOGY, Daejeon (KR)

(72) Inventors: Dong Soo Kwon, Daejeon (KR); Han Byeol Kim, Daejeon (KR); Dong Bum Pyo, Daejeon (KR); Se Min Ryu, Daejeon (KR); Byoung Kil Han, Daejeon (KR); Joon Yeong Kim, Daejeon (KR); Ju Yoon Kim, Gimpo-si (KR); Ji Ho Kim, Gimpo-si (KR); Hyeon Cheol Park, Gwangmyeong-si (KR)

(73) Assignee: DOT INCORPORATION, Seoul (KR)

( * ) Notice: Subject to any disclaimer, the term of this patent is extended or adjusted under 35 U.S.C. 154(b) by 300 days.

(21) Appl. No.: 16/637,791

(22) PCT Filed: Aug. 8, 2018

(86) PCT No.: PCT/KR2018/009012
§ 371 (c)(1),
(2) Date: Feb. 10, 2020

(87) PCT Pub. No.: WO2019/031836
PCT Pub. Date: Feb. 14, 2019

(65) Prior Publication Data
US 2020/0257365 A1    Aug. 13, 2020

(30) Foreign Application Priority Data

Aug. 8, 2017  (KR) .......................... 10-2017-0100443
Sep. 1, 2017  (KR) .......................... 10-2017-0111931

(51) Int. Cl.
G06F 3/01       (2006.01)
G06F 3/02       (2006.01)
(Continued)

(52) U.S. Cl.
CPC ............ G06F 3/016 (2013.01); G06F 3/0202 (2013.01); G08B 6/00 (2013.01); G09B 21/003 (2013.01);
(Continued)

(58) Field of Classification Search
None
See application file for complete search history.

(56) References Cited

U.S. PATENT DOCUMENTS

| 2015/0169061 | A1 | 6/2015 | Odajima et al. | |
| 2018/0277292 | A1* | 9/2018 | Zarate | G09B 21/004 |
| 2019/0385483 | A1* | 12/2019 | Cohen | G09B 21/004 |

FOREIGN PATENT DOCUMENTS

| JP | 2015-070729 A | 4/2015 |
| JP | 2015-230602 A | 12/2015 |

(Continued)

*Primary Examiner* — Matthew Yeung
(74) *Attorney, Agent, or Firm* — Novick, Kim & Lee PLLC; Jae Youn Kim

(57) ABSTRACT

Provided is an information output apparatus including one or more information output units, wherein each information output unit includes a coil arranged to be connected to a power source, such that a current flows in the coil; a base unit configured to accommodate the coil; and a driving indicator, which is arranged in the base unit to be apart from and close to the coil to be driven by a current flowing in the coil and is configured to move in a first direction toward the coil and a direction opposite thereto to rotate while being connected to the base unit and to move in a second direction crossing the first direction to be recognized by a user.

18 Claims, 26 Drawing Sheets

(51) Int. Cl.
*G09B 21/00* (2006.01)
*H01L 41/09* (2006.01)
*G08B 6/00* (2006.01)
*G09B 21/02* (2006.01)
*H01F 7/08* (2006.01)
*H01F 7/14* (2006.01)
*H01L 41/06* (2006.01)
*H01L 41/12* (2006.01)

(52) U.S. Cl.
CPC ........... *G09B 21/004* (2013.01); *G09B 21/02* (2013.01); *H01F 7/08* (2013.01); *H01F 7/14* (2013.01); *H01L 41/06* (2013.01); *H01L 41/09* (2013.01); *H01L 41/12* (2013.01)

(56) References Cited

FOREIGN PATENT DOCUMENTS

| | | |
|---|---|---|
| KR | 10-2007-0067448 A | 6/2007 |
| KR | 10-1661177 B1 | 9/2016 |
| KR | 10-2017-0052384 A | 5/2017 |
| WO | 2007/073125 A1 | 6/2007 |

\* cited by examiner

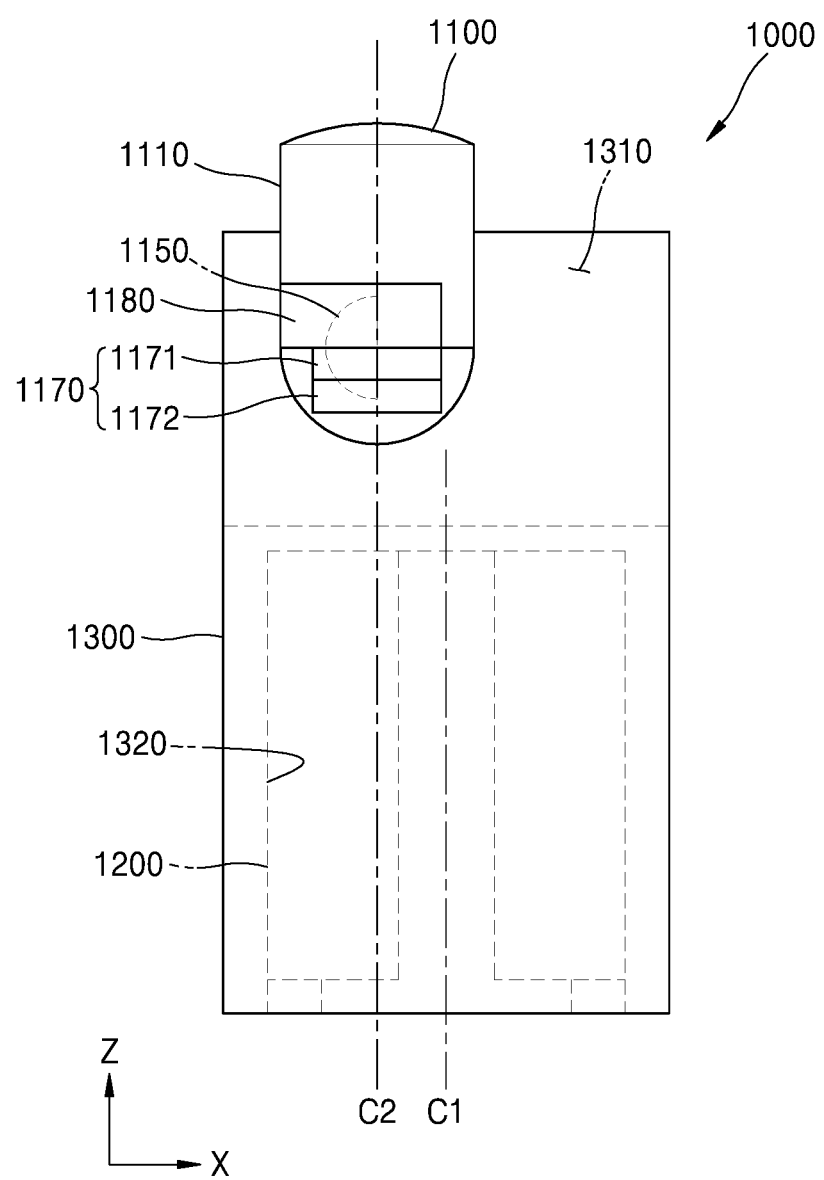

INFORMATION OUTPUT DEVICE

TECHNICAL FIELD

The present disclosure relates to an information output apparatus.

BACKGROUND ART

Users may recognize information in various ways. To this end, various types of information output apparatuses are used.

For example, visual information output apparatus using printed materials and auditory information output apparatus using sounds are used.

Particularly, with increase of the amount of information and development of technologies, information output apparatuses including electronic technologies are widely used, and display apparatuses each having a plurality of pixels are commonly used as visual information output apparatuses.

However, since such a display apparatus includes various circuits and elements, there are inconveniences for manufacturing and controlling such a display apparatus.

Meanwhile, due to factors including development of technologies and diversification of lifestyles, various types of information output forms are demanded.

For example, users may demand various information output apparatuses according to circumstances. In detail, when a user is handicapped for a particular sense, e.g., when a user is visually handicapped or incapacitated, information output through the tactile sense is demanded. In case of outputting information through the tactile sense, it is difficult to controlling and stably driving the information output, and thus there is a limit for improving user convenience through enhancing an information output apparatus.

DESCRIPTION OF EMBODIMENTS

Technical Problem

The present disclosure provides an information output apparatus with improved durability and user convenience.

Solution to Problem

According to an aspect of the present disclosure, an information output apparatus includes one or more information output units, wherein each information output unit includes a coil arranged to be connected to a power source, such that a current flows in the coil; a base unit configured to accommodate the coil; and a driving indicator, which is arranged in the base unit to be apart from and close to the coil to be driven by a current flowing in the coil and is configured to move in a first direction toward the coil and a direction opposite thereto to rotate while being connected to the base unit and to move in a second direction crossing the first direction to be recognized by a user.

The movement of the driving indicator in the second direction may include a rotational movement.

The base unit may include a first accommodating unit configured to accommodate the driving indicator and a second accommodating unit configured to accommodate the coil.

The first accommodating unit and the second accommodating unit of the base unit may be arranged apart from each other The driving indicator may include a main body region and a protrusion protruding from a side surface of the main body region, and the movement of the driving indicator may be controlled through the protrusion.

The protrusion may include a curved surface.

The base unit may include a driving groove corresponding to the protrusion of the driving indicator.

The driving groove may include a curved surface.

The base unit may include a locking hook for restricting the movement of the protrusion in the driving groove.

The driving indicator may include a first magnetic portion and a second magnetic portion having different polarities from each other.

The information output apparatus may include a plurality of information output units, wherein the plurality of information output units may be arranged to be apart from one another in one direction or another direction different therefrom.

According to an aspect of the present disclosure, an information output apparatus includes one or more information output units, wherein each information output unit includes a coil arranged to be connected to a power source, such that a current flows in the coil; a base unit configured to accommodate the coil; and a driving indicator, which is arranged in the base unit to be apart from and close to the coil to be driven by a current flowing in the coil, is configured to move in a first direction toward the coil and a direction opposite thereto to rotate while being connected to the base unit and to move in a second direction crossing the first direction to be recognized by a user, and is configured to induce therein a magnetic field having a magnetic axis-wise direction eccentric in one direction.

A magnetic portion including a first magnetic portion and a second magnetic portion having different polarities from each other may be arranged inside the driving indicator.

The driving indicator may include a magnetic body adjacent to the magnetic portion.

The magnetic portion may be tilted with the lengthwise direction of the driving indicator to have a magnetic axis-wise direction eccentric with the driving indicator.

The magnetic portion may have a length extended to reach a center point of the driving indicator in the lengthwise direction.

The movement of the driving indicator in the second direction may include a rotational movement.

The driving indicator may include a main body region and a protrusion protruding from a side surface of the main body region, and the movement of the driving indicator may be controlled through the protrusion.

The base unit may include a driving groove corresponding to the protrusion of the driving indicator.

The information output apparatus may include a plurality of information output units, wherein the plurality of information output units may be arranged to be apart from one another in one direction or another direction different therefrom.

Other aspects, features, and advantages will become apparent from the following drawings, claims, and detailed description of the present disclosure.

An information output apparatus according to the present embodiment may improve durability and user convenience.

BRIEF DESCRIPTION OF DRAWINGS

FIG. 14 is a diagram showing relative positions of a driving indicator and a coil of the information output apparatus of FIG. 9;

MODE OF DISCLOSURE

Figure 1:
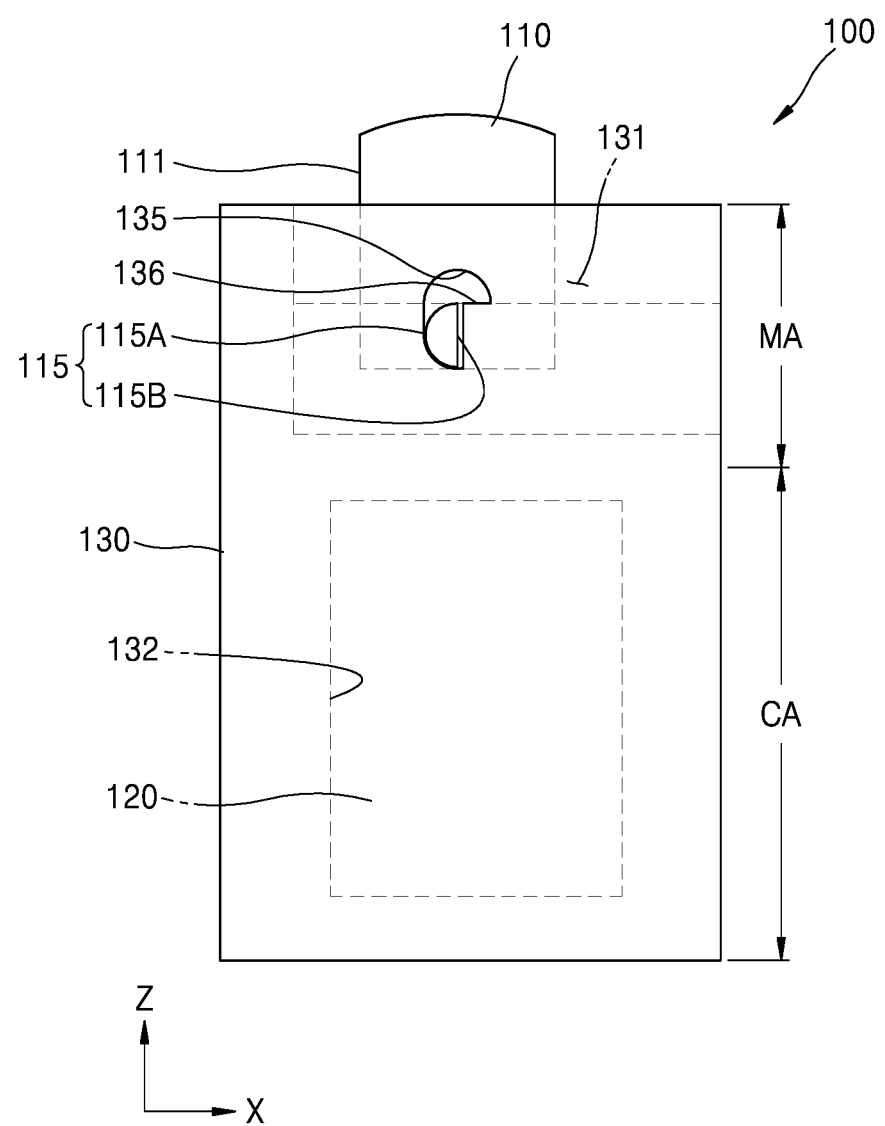
FIG. 1 is a schematic perspective front view of an information output apparatus according to another embodiment of the present disclosure.

The present disclosure may include various embodiments and modifications, and embodiments thereof will be illustrated in the drawings and will be described herein in detail. The effects and features of the present disclosure and the accompanying methods thereof will become apparent from the following description of the embodiments, taken in conjunction with the accompanying drawings. However, the present disclosure is not limited to the embodiments described below, and may be embodied in various modes.

Reference will now be made in detail to embodiments, examples of which are illustrated in the accompanying drawings. In the drawings, the same elements are denoted by the same reference numerals, and a repeated explanation thereof will not be given.

It will be understood that although the terms "first", "second", etc. may be used herein to describe various elements, these elements should not be limited by these terms. These terms are only used to distinguish one element from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
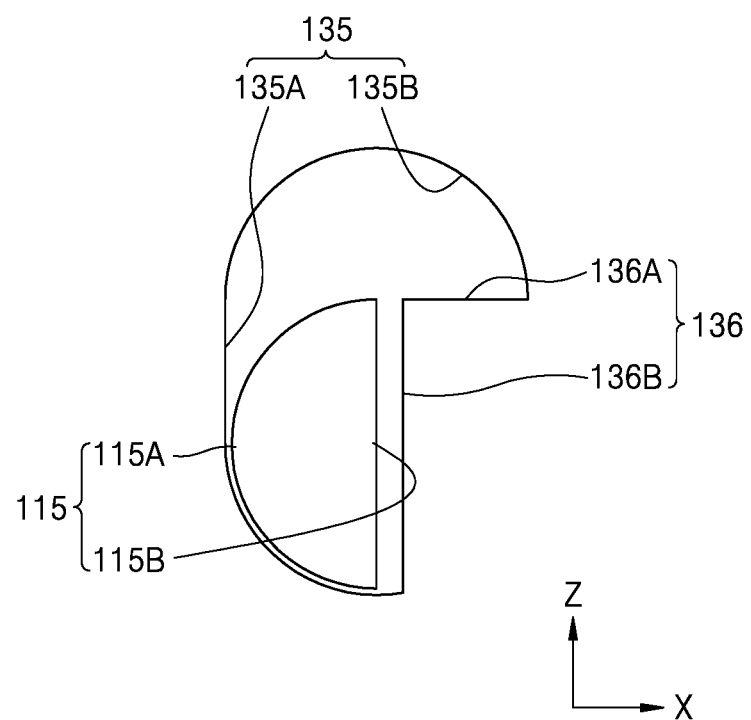
FIG. 2 is an enlarged view of a portion of FIG. 1.

FIG. 1 is a schematic perspective front view of an information output apparatus according to an embodiment of the present disclosure, and FIG. 2 is an enlarged view of a portion of FIG. 1. In detail, FIG. 2 is an enlarged view of a protrusion of a driving indicator and a driving groove of a base unit of FIG. 1.

Referring to FIGS. 1 and 2, an information output apparatus 100 of the present embodiment includes at least one information output unit, and FIG. 1 shows one information output unit. In other words, the information output apparatus 100 of FIG. 1 may be a single information output unit.

Although FIG. 1 shows the one information output unit, the information output apparatus 100 may include two, three, or more information output units according to some embodiments.

In other words, the information output apparatus 100 may include various numbers of information output units according to purposes, characteristics of applied products, and user characteristics.

For convenience of explanation, an information output apparatus including one information output unit as shown in FIG. 1 will be described.

The information output apparatus 100 may include a driving indicator 110, a coil 120, and a base unit (base) 130.

The driving indicator 110 may be moved by a magnetic field generated by a current flowing in the coil 120 described below.

The driving indicator 110 may include a material having magnetic properties.

According to some embodiments, the driving indicator 110 may include a magnetic material and may include, for example, a permanent magnet.

At this time, for example, when the driving indicator 110 includes a permanent magnet, the N pole and the S pole of the permanent magnet may be arranged in the lengthwise direction of the driving indicator 110, which may the Z-axis direction in FIG. 1.

The driving indicator 110 may perform a rotational movement, for example, an angular movement at a predetermined angle.

The driving indicator 110 may move to protrude in one direction and may change a position thereof by moving up and down in at least the lengthwise direction of the driving indicator 110. Therefore, the driving indicator 110 may move to protrude in one direction, and a user may sense the movement of the driving indicator 110 tactilely or visually.

The driving indicator 110 may include a protrusion 115 protruding from a side surface of the major main body region 111.

Although not shown, the driving indicator 110 may include two protrusions 115 protruding on both side surfaces of the major main body region 111 facing each other.

The protrusion 115 may include a side surface 115A having at least a curved region and a fixing portion 115B.

The fixing portion 115B may have a flat surface in at least one region.

In some embodiments, the major main body region 111 of the driving indicator 110 may have a long extended pillar-like shape.

In this case, an end portion of the driving indicator 110 may have a curved surface, and edges of the driving indicator 110 may be rounded.

The protrusion 115 of the driving indicator 110 may be formed to be adjacent to an end portion opposite to an end portion of a side surface region of the major main body region 111 of the driving indicator 110 (i.e., an end portion protruding toward a user in the lengthwise direction of the driving indicator 110).

The driving indicator 110 may be arranged in a first accommodating unit (first accommodator) 131 of a base unit 130 to be described below.

A coil 120 may be arranged to be adjacent to the driving indicator 110. Also, the coil 120 may be arranged in a second accommodating unit (second accommodator) 132 of the base unit 130 to be described below.

A power supply unit (not shown) may be connected to the coil 120, and, when a current flows in the coil 120, a magnetic field may be formed around the coil 120.

The coil 120 may have various shapes. For example, the coil 120 may have a shape in which a plurality of circuit wires are wound, and the number of times that the circuit wires are wound may be variously adjusted.

The driving indicator 110 may be moved by the magnetic field generated by a current flowing in the coil 120.

In some embodiments, the coil 120 may be arranged to be apart from the driving indicator 110, and the driving indicator 110 may be arranged to face a side of the coil 120 in one direction.

The base unit 130 may be formed to accommodate the driving indicator 110 and the coil 120.

In some embodiments, the base unit 130 may include a first region CA corresponding to the coil 120 and a second region MA corresponding to the driving indicator 110, and the second region MA may be adjacent to the first region CA. For example, the first region CA and the second region MA of the base unit 130 may be connected to each other without overlapping each other.

In detail, the base unit 130 may include the first accommodating unit 131 and the second accommodating unit 132.

The first accommodating unit 131 may include a space for accommodating the driving indicator 110. The first accommodating unit 131 may be a space formed by removing a portion of the base unit 130 having a predetermined width and a predetermined length. The first accommodating unit 131 may be open to at least one surface of the base unit 130. Through this, the driving indicator 110 accommodated in the first accommodating unit 131 may protrude from the first accommodating unit 131 while being accommodated in the first accommodating unit 131.

In some embodiments, the first accommodating unit 131 may be open to the top surface of the base unit 130 and one side surface connected thereto.

The length of the first accommodating unit 131 may be at least corresponding to or greater than the length of the driving indicator 110. Therefore, the driving indicator 110 may be accommodated in the first accommodating unit 131 not only when the driving indicator 110 moves in a first direction, e.g., upward, and moves in an opposite direction, that is, downward, but also when the driving indicator 110 moves in a second direction crossing the first direction (e.g., when the driving indicator 110 is rotated by 90 degrees and is positioned horizontally).

The second accommodating unit 132 may include a space for accommodating the coil 120. The second accommodating unit 132 may accommodate the coil 120, and the second accommodating unit 132 may be distinguished from the first accommodating unit 131. For example, the first accommodating unit 131 and the second accommodating unit 132 may be arranged apart from each other and not connected to each other.

Therefore, the coil 120 and the driving indicator 110 may be separated spatially.

In some embodiments, the coil 120 may be accommodated in the second accommodating unit 132 and surrounded by the base unit 130. In another example, the coil 120 may be surrounded by the base unit 130 except for a region of the coil 120 connected to an external power supply unit (not shown).

The base unit 130 may include a driving groove 135 and a locking hook 136.

The driving groove 135 may be formed to be connected to the first accommodating unit 131. The protrusion 115 of the driving indicator 110 may correspond to the driving groove 135.

For example, when the driving indicator 110 is accommodated in the first accommodating unit 131, the protrusion 115 of the driving indicator 110 may correspond to the driving groove 135.

FIGS. 1 and 2 show that the driving groove 135 has a shape penetrating through the side surface of the base unit 130. Although not shown, the driving groove 135 may be connected to the first accommodating unit 131 and may not penetrate through the side surface of the base unit 130. In other words, the driving groove 135 may have a groove shape instead of a penetrating shape.

The driving groove 135 may include a first region 135A and a second region 135B. The first region 135A may be arranged closer to the second accommodating unit 132 than the second region 135B.

The first region 135A may be formed to support the protrusion 115 when the driving indicator 110, for example, the protrusion 115 of the driving indicator 110 is closest to the coil 120.

To this end, the first region 135A may have an edge surface similar to that of a side surface 115A of the protrusion 115 of the driving indicator 110, and for example, the first region 135A may have a curved surface.

Also, the first region 135A may have an appropriate width to facilitate the movement of the driving indicator 110 in the first direction, that is, the direction away from the coil 120, and in the opposite direction. Also, the first region 135A may be formed to extend in the first direction to be connected to the second region 135B.

The second region 135B is connected to the first region 135A and may have a shape extending in the second direction crossing the first direction. As described above, the first direction is a direction in which the driving indicator 110 moves away from the coil 120 and is the Z-axis direction in FIGS. 1 and 2.

In some embodiments, the second direction may be a direction orthogonal to the first direction, e.g., the X-axis direction in FIGS. 1 and 2.

For convenience of explanation, the first direction and the second direction will be used as having the same meanings in the descriptions below.

The second region 135B may be formed to correspond to the protrusion 115 when the driving indicator 110 moves in the first direction and then moves in the second direction.

In other words, when the driving indicator 110 is rotated, the protrusion 115 may rise from the first region 135A, be rotated by a predetermined angle, and arranged in the second region 135B.

The second region 135B may have a shape corresponding to a state in which the protrusion 115 is arranged by being rotated, and may have, for example, a curved surface.

Also, the second region 135B may have an appropriate width to facilitate the downward movement of the driving indicator 110 in the direction opposite to the first direction, e.g., downward movement after being rotated, after the driving indicator 110 returns in the second direction.

Also, the second region 135B may have a shape similar to a state that the first region 135A is rotated.

The base unit 130 may include a locking hook 136 to maintain the state after the driving indicator 110 is arranged in the second region 135B. The locking hook 136 includes a top surface 136A and a side surface 136B. The top surface 136A and the side surface 136B of the locking hook 136 are connected to each other and may correspond to the fixing portion 115B of the protrusion 115 according to the movement of the driving indicator 110.

In other words, in the state shown in FIG. 1, when there is no external force applied to the fixing portion 115B of the protrusion 115 of the driving indicator 110, the movement, e.g., rotation, of the fixing portion 115B may be restricted by the side surface 136B of the locking hook 136.

Also, when the protrusion 115 corresponds to the second region 135B of the driving groove 135 as the driving indicator 110 moves, the movement of the fixing portion 115B of the protrusion 115 may be restricted by the top surface 136A of the locking hook 136.

FIGS. 3A to 3D are diagrams for describing the operation of the information output apparatus of FIG. 1.

The operation of the information output apparatus will be described by sequentially referring to FIGS. 3A to 3D.

Figure 3A:
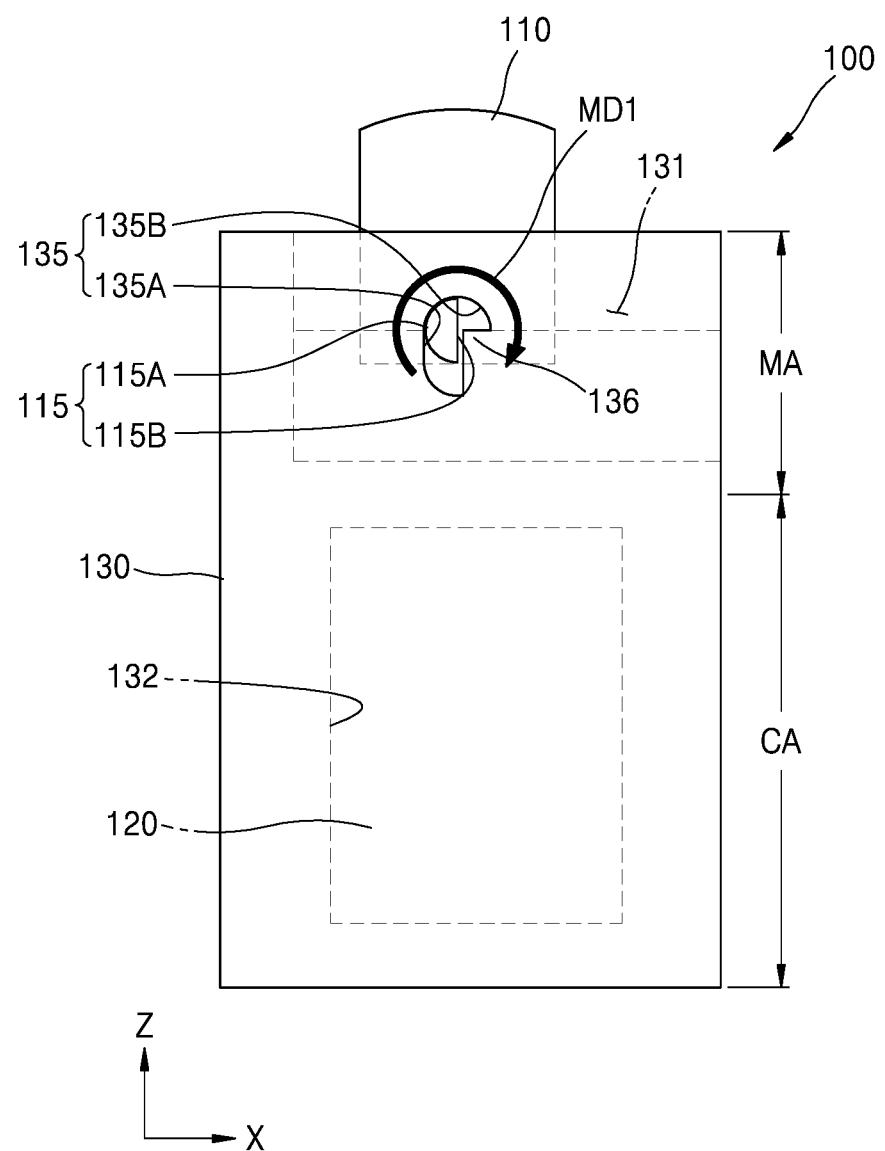
FIGS. 3A to 3D are diagrams for describing the operation of the information output apparatus of FIG. 1.

FIG. 3A shows a state that the driving indicator 110 of the information output apparatus 100 is elevated as compared to the state shown in FIG. 1. In other words, the driving indicator 110 has moved upward in the first direction, and, compared to FIG. 1, the driving indicator 110 may be arranged to be farther away from the coil 120.

The movement of the driving indicator 110 may be caused by a magnetic field generated by a current flowing in the coil 120, and the driving indicator 110 may move by receiving a repulsive force from the magnetic field generated around the coil 120 according to the polarity of a magnetic material included in the driving indicator 110, e.g., a permanent magnet.

At this time, the driving indicator 110 may move while the protrusion 115 of the driving indicator 110 is connected to the driving groove 135 of the base unit 130.

In detail, the protrusion 115 may rise in the first direction from the first region 135A of the driving groove 135 and reach a point at which the protrusion 115 is unable to move further in the first direction due to the edge of the second region 135B in the first region 135A, that is, a highest point, and thus the driving indicator 110 may also reach a highest point in the first direction.

Figure 3B:
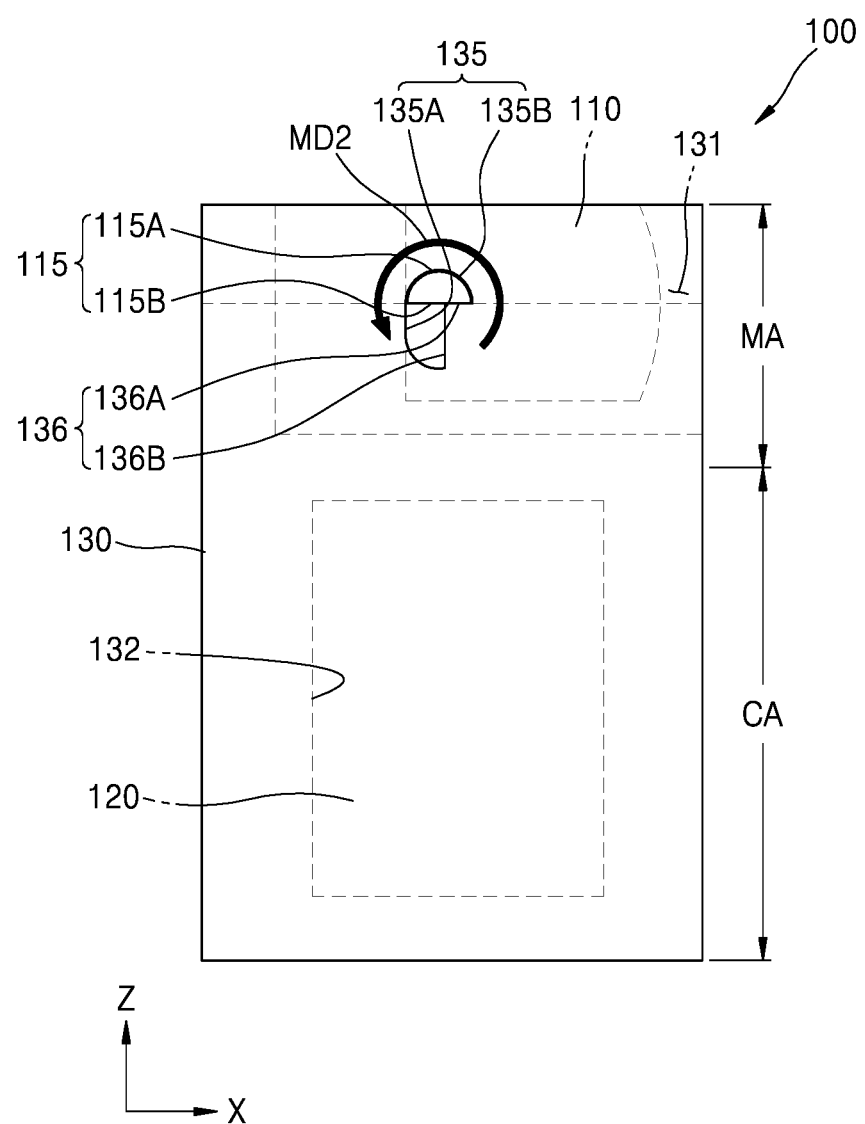

FIG. 3B shows a state in which the driving indicator 110 is rotated in a direction MD1 of FIG. 3A from the state shown in FIG. 3A.

As a result, an end portion of the driving indicator 110 in the first direction may face the second direction crossing the first direction instead of facing the first direction. Here, in some embodiments, the second direction may be orthogonal to the first direction.

In some embodiments, the driving indicator 110 may be arranged to not to be past the top surface of the base unit 160 after the movement. In other words, the entire regions of the driving indicator 110 may be accommodated in the first accommodating unit 131 of the base unit 160, and thus the driving indicator 110 may not be past the first accommodating unit 131.

When force in the first direction is transmitted to the driving indicator 110 by the magnetic field due to the coil 120 in the state of FIG. 3A (i.e., when repulsive force is applied), the protrusion 115 is arranged in the second region 135B of the driving groove 135 by the curved surface of the protrusion 115 and the curved surface of the second region 135B or the curved surfaces of the first region 135A and the second region 135A, thereby facilitating rotation of the driving indicator 110.

In some embodiments, the state of FIG. 3B may be recognized by a user as an OFF state of the driving indicator 110, and the state of FIG. 1 or 3A opposite to the OFF state may be recognized as an ON state of the driving indicator 110.

The state of FIG. 3B may be maintained without applying a separate force to the driving indicator 110. In other words, the protrusion 115 of the driving indicator 110 may be kept fixed by the locking hook 136. In detail, the fixing portion 115B of the protrusion 115 may be arranged on the top surface 136A of the locking hook 136, and, since both the fixing portion 115B and the top surface 136A of the locking hook 136 have flat surfaces, the protrusion 115 may be fixed more stably.

Therefore, power for driving the driving indicator 110 may be reduced, and, as a result, driving efficiency of the information output apparatus 100 may be improved.

Also, even when force (e.g., repulsive force) is applied to the driving indicator 110 in the first direction, the state of FIG. 3B may be easily maintained.

Figure 3C:
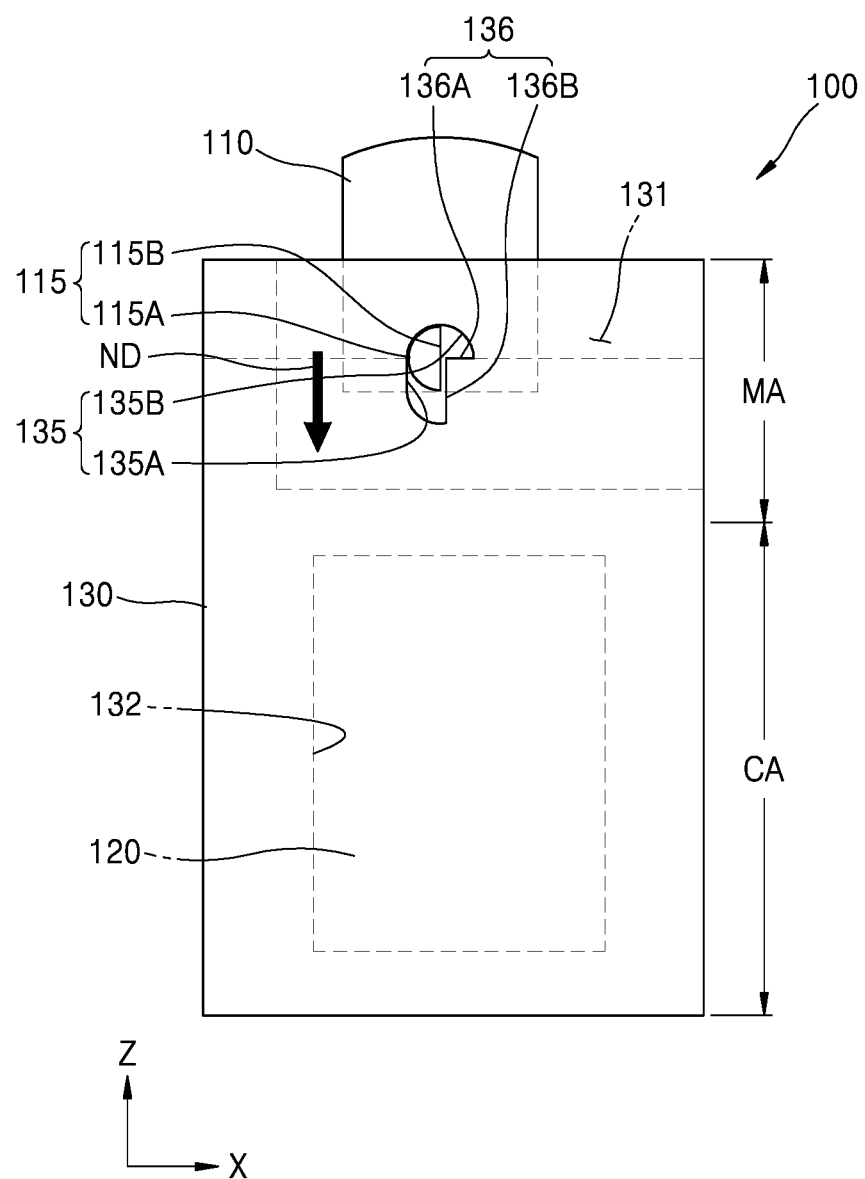

Next, FIG. 3C shows a state in which the driving indicator 110 is rotated in a direction MD2 of FIG. 3B from the state shown in FIG. 3B. In other words, FIG. 3C shows a state which the driving indicator 110 is rotated in a direction opposite to the direction MD1 described above.

Therefore, the driving indicator 110 is in a state same as that shown in FIG. 3A.

The movement of the driving indicator 110 rotating in the direction MD2 shown in FIG. 3B into the state of FIG. 3C may be caused by force for moving the driving indicator 110 in a direction opposite to the first direction, that is, force for moving the driving indicator 110 downward.

In detail, the movement of the driving indicator 110 from the state of FIG. 3B to the state of FIG. 3C may be caused by a magnetic field generated by a current flowing in the coil 120. For example, the driving indicator 110 may move by receiving attracting force from the magnetic field generated around the coil 120 according to the polarity of the magnetic material included in the driving indicator 110 (e.g., a permanent magnet).

For example, in the state shown in FIG. 3B, when force in a direction opposite to the first direction, that is, force for moving the driving indicator 110 close to the coil 120 (e.g., attractive force) is applied to the driving indicator 110 by the magnetic field due to the coil 120, the protrusion 115 is arranged in the first region 135A by the curved surface of the side surface 115A of the protrusion 115 and the curved surface of the second region 135B of the driving groove 135 or the curved surfaces of the first region 135A and the second region 135B, thereby facilitating rotation of the driving indicator 110 in the direction MD2.

Figure 3D:
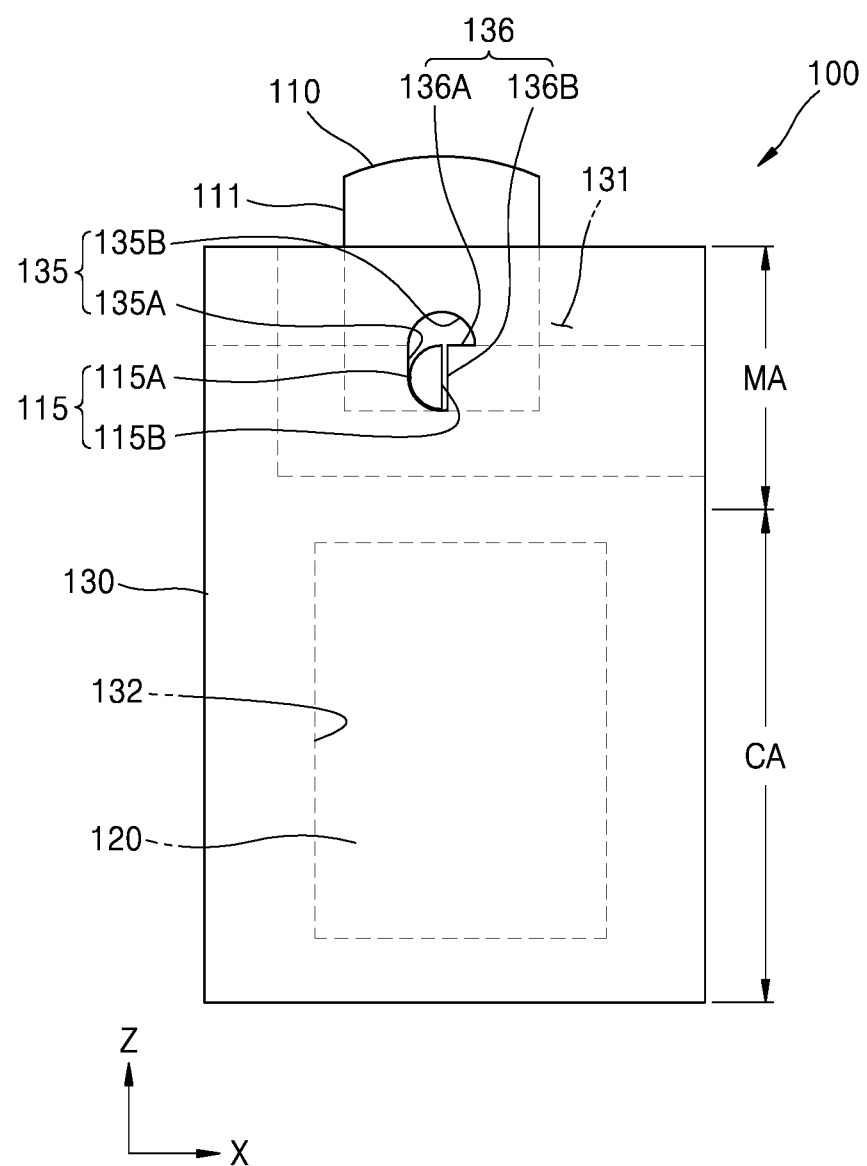

Next, FIG. 3D shows a state that the driving indicator 110 is moved in a direction ND from the state of FIG. 3C.

In other words, the driving indicator 110 may move in a direction opposite to the first direction from the state of FIG. 3C, e.g., a downward direction toward the coil 120, and may be arranged as shown in FIG. 1.

The movement from the state of FIG. 3C to the state of FIG. 3D may be caused by the force applied to the driving indicator 110 in FIG. 3c, that is, the force for moving the driving indicator 110 in the direction opposite to the first direction (e.g., force to move the driving indicator 110 downward). In detail, the movement may be caused by force applied to the driving indicator 110 by the magnetic field generated by the coil 120.

Also, in some embodiments, even when no separate force is applied in the state of FIG. 3C, the driving indicator 110 may move downward due to the gravity and be arranged in the state of FIG. 3D.

Also, in this case, the movement of the driving indicator 110 may be controlled as long as a predetermined force is not transmitted to the driving indicator 110 in the first direction. For example, the movement or the rotation of the driving indicator 110 in the second direction may be controlled by the side surface 136B of the locking hook 136 of the base unit 130.

In some embodiments, the side surface 136B of the locking hook 136 may have a flat surface.

The information output apparatus according to the present embodiment may include one or more information output units, and driving indicators of the one or more information output unit may move at least in the first direction or the direction opposite thereto. Various information that may be sensed by a user may be output through the driving indicators.

For example, the information output apparatus according to the present exemplary embodiment may be a tactile sensing type information output apparatus that a user may recognize a protrusion of a driving indicator through a tactile sense. More particularly, information may be output in the form of Braille output.

In some embodiment, the information output apparatus may be a visually-sensing type information output apparatus that a user may visually recognize a protrusion of a driving indicator. Particularly, when a color is formed on one surface of the driving indicator, for example, the top surface, or when light is emitted from one surface of the driving indicator, the visual recognition effect may be increased.

Accordingly, the information output apparatus according to the present embodiment may output information to a user. In some embodiments, the information output apparatus according to the present embodiment may output various information to a user when the information output apparatus includes a plurality of information output units.

Also, in detail, a driving indicator may be easily moved in the first direction by a magnetic field generated by a coil (e.g., upward movement) and may be moved in the second direction by a protrusion and a driving groove of the driving indicator (e.g., clockwise rotation). Also, the rotation may be restricted as a fixing portion of the protrusion is supported by a locking hook of the driving groove. Therefore, a state in which protrusion of the driving indicator is low (e.g., an OFF state) may be easily maintained.

Then, when force is applied to the driving indicator in the direction opposite to the first direction, the driving indicator may be rotated by the protrusion and the driving groove of the driving indicator, e.g., rotation in the counterclockwise direction, and, even when the force is continuously applied or the force is removed, the driving indicator may move in the direction opposite to the first direction, e.g., moving downward. Also, further rotation may be restricted as a fixing portion of the protrusion is supported by a locking hook of the driving groove. Also, the protruding state (e.g., the ON state) of the driving indicator may be maintained.

Accordingly, the ON state and the OFF state of the driving indicator may be easily switched and maintained, power consumption for the movement of the driving indicator may be reduced, and the overall energy efficiency of an information output apparatus may be improved.

Figure 4:
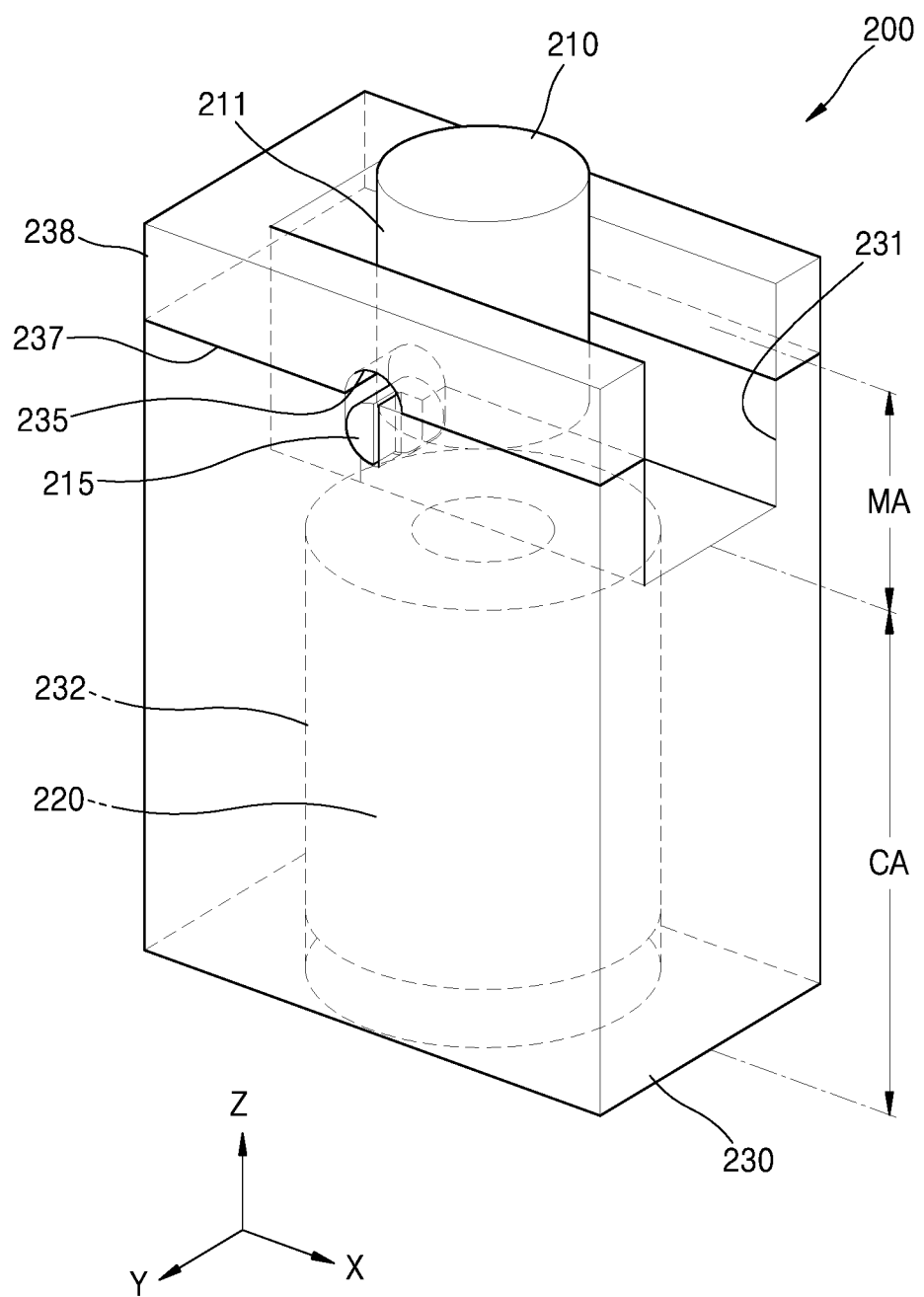
FIG. 4 is a schematic perspective view of an information output apparatus according to another embodiment of the present disclosure.
Figure 5:
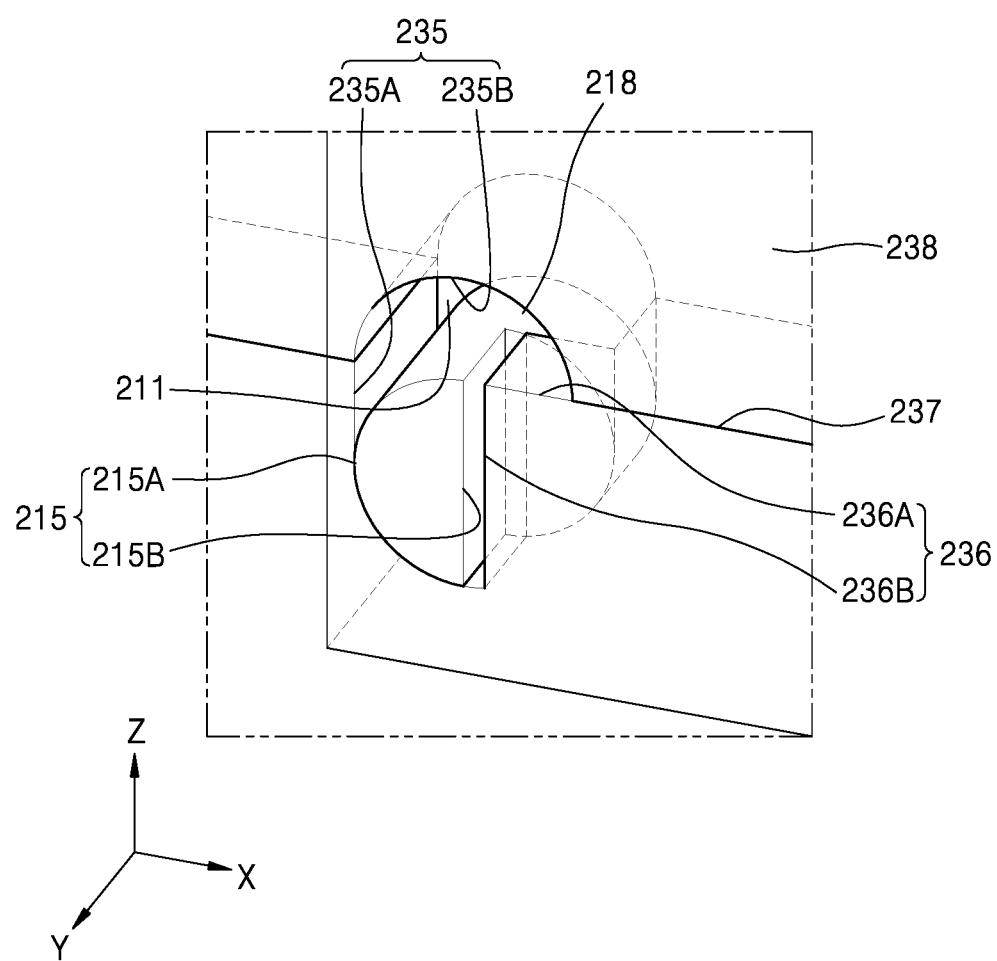
FIG. 5 is an enlarged view of a portion of FIG. 4.

FIG. 4 is a schematic perspective front view of an information output apparatus according to another embodiment of the present disclosure, and FIG. 5 is an enlarged view of a portion of FIG. 4. In detail, FIG. 5 is an enlarged view of a protrusion of a driving indicator and a driving groove of a base unit of FIG. 4.

Referring to FIGS. 4 and 5, an information output apparatus 200 of the present embodiment includes at least one information output unit, and FIG. 4 shows one information output unit. In other words, the information output apparatus 200 of FIG. 4 may be a single information output unit.

Although FIG. 4 shows the one information output unit, the information output apparatus 200 may include two, three, or more information output units according to some embodiments.

In other words, the information output apparatus 200 may include various numbers of information output units according to purposes, characteristics of applied products, and user characteristics.

For convenience of explanation, an information output apparatus including one information output unit as shown in FIG. 4 will be described.

The information output apparatus 200 may include a driving indicator 210, a coil 220, and a base unit 230.

The driving indicator 210 may be moved by a magnetic field generated by a current flowing in the coil 220 described below.

The driving indicator 210 may include a material having magnetic properties.

According to some embodiments, the driving indicator 210 may include a magnetic material and may include, for example, a permanent magnet.

In this case, for example, when the driving indicator 210 includes a permanent magnet, the N pole and the S pole of the permanent magnet may arranged in the lengthwise direction of the driving indicator 210, e.g., the Z-axis direction of FIG. 4 as the first direction.

The driving indicator 210 may move to protrude in one direction and may change a position thereof by moving up and down in at least the lengthwise direction of the driving indicator 210. Therefore, the driving indicator 210 may move to protrude in one direction, and a user may sense the movement of the driving indicator 210 tactilely or visually.

The driving indicator 210 may include a protrusion 215 protruding from a side surface of the major main body region 211. Although not shown, the driving indicator 210 may include two protrusions 215 protruding on both side surfaces of the major main body region 211 facing each other.

In some embodiments, a protrusion connecting portion 218 may be further included between the protrusion 215 and the main body region 211. The protrusion connecting portion 218 may protrude from a side surface of the main body region 211 and may have a width greater than that of the protrusion 215. The protrusion connecting portion 218 may be arranged at a location not caught by a locking hook 236 of the base unit 230 which will be described below.

The protrusion connecting portion 218 is formed between the main body region 211 and the protrusion 215 of the driving indicator 210 to have a width greater than that of the protrusion 215, thereby distributing locally received force applied to the protrusion 215 during rotational movement and restriction by the driving groove 235 and the locking hook 236 described below to reduce damages or deformation of the protrusion 215 and to facilitate the rotation of the protrusion 215.

The protrusion 215 may include a side surface 215A having at least a curved region and a fixing portion 215B.

The fixing portion 215B may have a flat surface in at least one region.

In some embodiments, the major main body region 111 of the driving indicator 110 may have a long pillar-like shape extending in one direction, that is, the lengthwise direction.

In this case, an end portion of the driving indicator 210 may have a curved surface, and edges of the driving indicator 210 may be rounded.

The protrusion 215 of the driving indicator 210 may be formed to be adjacent to an end portion opposite to an end portion of a side surface region of the major main body region 211 of the driving indicator 210 (i.e., an end portion protruding toward a user in the lengthwise direction of the driving indicator 210).

The driving indicator 210 may be arranged in a first accommodating unit 231 of a base unit 230 to be described below.

A coil 220 may be arranged to be adjacent to the driving indicator 210. Also, the coil 220 may be arranged in a second accommodating unit 232 of the base unit 230 to be described below.

A power supply unit (not shown) may be connected to the coil 220, and, when a current flows in the coil 220, a magnetic field may be formed around the coil 220.

The coil 220 may have various shapes. For example, the coil 220 may have a shape in which a plurality of circuit wires are wound, and the number of times that the circuit wires are wound may be variously adjusted.

The driving indicator 210 may be moved by the magnetic field generated by a current flowing in the coil 220.

In some embodiments, the coil 220 may be arranged to be apart from the driving indicator 210, and the driving indicator 210 may be arranged to face a side of the coil 220 in one direction.

The base unit 230 may be formed to accommodate the driving indicator 210 and the coil 220.

In some embodiments, the base unit 230 may include the first region CA corresponding to the coil 220 and the second region MA corresponding to the driving indicator 210, and the second region MA may be adjacent to the first region CA. For example, the first region CA and the second region MA of the base unit 230 may be connected to each other without overlapping each other.

In detail, the base unit 230 may include the first accommodating unit 231 and the second accommodating unit 232.

The first accommodating unit 231 may include a space for accommodating the driving indicator 210. The first accommodating unit 231 may be a space formed by removing a portion of the base unit 230 having a predetermined width and a predetermined length. The first accommodating unit 231 may be open to at least one surface of the base unit 230. Through this, the driving indicator 210 accommodated in the first accommodating unit 231 may protrude from the first accommodating unit 231 while being accommodated in the first accommodating unit 231.

In some embodiments, the first accommodating unit 231 may be open to the top surface of the base unit 230 and one side surface connected thereto.

The length of the first accommodating unit 231 may be at least corresponding to or greater than the length of the driving indicator 210. Therefore, the driving indicator 210 may be accommodated in the first accommodating unit 231 not only when the driving indicator 210 moves in a first direction, e.g., upward, and moves in an opposite direction, that is, downward, but also when the driving indicator 210 moves in a second direction crossing the first direction (e.g., when the driving indicator 210 is rotated by 90 degrees and is positioned horizontally).

The second accommodating unit 232 may include a space for accommodating the coil 220. The second accommodating unit 232 may accommodate the coil 220, and the second accommodating unit 232 may be distinguished from the first accommodating unit 231. For example, the first accommodating unit 231 and the second accommodating unit 232 may be arranged apart from each other and not connected to each other.

Therefore, the coil 220 and the driving indicator 210 may be separated spatially.

In some embodiments, the coil 220 may be accommodated in the second accommodating unit 232 and surrounded by the base unit 230. In another example, the coil 220 may be surrounded by the base unit 230 except for a region of the coil 220 connected to an external power supply unit (not shown).

The base unit 230 may include a driving groove 235 and a locking hook 236.

The driving groove 235 may be formed to be connected to the first accommodating unit 231. The protrusion 215 of the driving indicator 210 may correspond to the driving groove 235.

For example, when the driving indicator 210 is accommodated in the first accommodating unit 231, the protrusion 215 of the driving indicator 210 may correspond to the driving groove 235.

FIGS. 4 and 5 show that the driving groove 235 has a shape penetrating through the side surface of the base unit 230. Although not shown, the driving groove 235 may be connected to the first accommodating unit 231 and may not penetrate through the side surface of the base unit 230. In other words, the driving groove 235 may have a groove shape instead of a penetrating shape.

The driving groove 235 may include a first region 235A and a second region 235B. The first region 235A may be arranged closer to the second accommodating unit 232 than the second region 235B.

The first region 235A may be formed to support the protrusion 215 when the driving indicator 210, for example, the protrusion 215 of the driving indicator 210 is closest to the coil 220.

To this end, the first region 235A may have an edge surface similar to that of a side surface 215A of the protrusion 215 of the driving indicator 210, and for example, the first region 235A may have a curved surface.

Also, the first region 235A may have an appropriate width to facilitate the movement of the driving indicator 210 in the first direction, that is, the direction away from the coil 220, and in the opposite direction. Also, the first region 235A may be formed to extend in the first direction to be connected to the second region 235B.

The second region 235B is connected to the first region 235A and may have a shape extending in the second direction crossing the first direction. As described above, the first direction is a direction in which the driving indicator 210 moves away from the coil 220 and is the Z-axis direction in FIGS. 4 and 5.

Also, in some embodiments, the second direction may be a direction orthogonal to the first direction, e.g., the X-axis direction in FIG. 4.

The second region 235B may be formed to correspond to the protrusion 215 when the driving indicator 210 moves in the first direction and then moves in the second direction.

In other words, when the driving indicator 210 is rotated, the protrusion 215 may rise from the first region 235A, be rotated by a predetermined angle, and arranged in the second region 235B.

The second region 235B may have a shape corresponding to a state in which the protrusion 215 is arranged by being rotated, and may have, for example, a curved surface.

Also, the second region 235B may have an appropriate width to facilitate the downward movement of the driving indicator 210 in the direction opposite to the first direction, e.g., downward movement after being rotated, after the driving indicator 210 returns in the second direction.

Also, the second region 235B may have a shape similar to a state that the first region 235A is rotated.

The base unit 230 may include a locking hook 236 to maintain the state after the driving indicator 210 is arranged in the second region 235B. In other words, a fixing portion 215B of the protrusion 215 of the driving indicator 210 may be arranged on a top surface 236A of the locking hook 236 to fix the driving indicator 210. In some embodiments, the top surface 236A of the locking hook 236 may have a flat surface.

In some embodiments, the base unit 230 may have a separated region 238 based on a boundary line 237 which connects the driving groove 235. For example, when an edge of the separated region 238 corresponds to the boundary line 237 to separate the separated region 238 from the rest of the base unit 230, the driving groove 235 may be open.

In an alternative embodiment, the driving indicator 210 may arranged in the first accommodating unit 231 before arranging the separated region 238 in the remaining portion of the base unit 230 or combining the separated region 238 with the remaining portion of the base unit 230, the indicator 210 may be easily arranged at the base unit 230.

The operation of the information output apparatus 200 of the present embodiment is similar to that of FIGS. 3A to 3D described above.

Briefly, it may be considered that the driving indicator 210 of FIG. 4 indicates the ON state. In other words, force may be applied by the coil 220 to the driving indicator 210 in the direction opposite to the first direction, that is, the downward force in the Z-axis direction of FIG. 4.

Also, in some embodiments, the driving indicator 210 may be in a state in which the force in the direction opposite to the first direction is applied thereto and the force is removed. In other words, the protrusion 215 of the driving indicator 210 may be kept fixed by the driving groove 235.

The fixing portion 215B of the protrusion 215 may maintain a state in which rotation thereof is restricted by the side surface 236B of the locking hook 236 of the base unit 230.

Then, when the force in the first direction is applied to the driving indicator 210 due to the generation of the magnetic field through the coil 220, the driving indicator 210 may move in the first direction, that is, the upward movement, and thus the driving indicator 210 may be arranged to be further away from the coil 220 as compared to the arrangement shown in FIG. 4.

The movement of the driving indicator 210 may be caused by a magnetic field generated by a current flowing in the coil 120, and the driving indicator 210 may move by receiving a repulsive force from the magnetic field generated around the coil 220 according to the polarity of a magnetic material included in the driving indicator 210, e.g., a permanent magnet.

At this time, the driving indicator 210 may move while the protrusion 215 of the driving indicator 210 is connected to the driving groove 235 of the base unit 230.

In detail, the protrusion 215 may rise in the first direction from the first region 235A of the driving groove 235 and reach a point at which the protrusion 215 is unable to move further in the first direction due to the edge of the second region 235B in the first region 235A, that is, a highest point, and thus the driving indicator 210 may also reach a highest point in the first direction.

Also, when the force in the first direction is continuously applied to the driving indicator 210, the driving indicator 210 may be rotated, and thus an end portion of the driving indicator 210 in the first direction may face a second direction crossing the first direction instead of facing the first direction. In some embodiments, as shown in FIG. 4, the driving indicator 210 may face the X-axis direction instead of the Z-axis direction. To this end, a first accommodating unit 231 having a size corresponding to the length of the driving indicator 210 may be formed.

When force in the first direction is continuously transmitted to the driving indicator 210 by the magnetic field due to the coil 220 (i.e., when repulsive force is applied), the protrusion 215 is arranged in the second region 235B of the driving groove 235 by the curved surface of the protrusion 215 and the curved surface of the second region 235B or the curved surfaces of the first region 235A and the second region 235A, thereby facilitating rotation of the driving indicator 210. As a result, the rotation as described above may be performed.

In some embodiments, the driving indicator 110 may be arranged to not to be past the top surface of the base unit 160 even when the driving indicator 210 is rotated. In other words, the entire regions of the driving indicator 210 may be accommodated in the first accommodating unit 231 of the base unit 260, and thus the driving indicator 210 may not be past the first accommodating unit 231.

Also, after the rotational movement, the protrusion 215 of the driving indicator 210 may be kept fixed by the locking hook 236 without applying a separate force to the driving indicator 210. In detail, the fixing portion 215B of the protrusion 215 may be arranged on the top surface 236A of the locking hook 236, and, since both the fixing portion 215B and the top surface 236A of the locking hook 236 have flat surfaces, the protrusion 215 may be fixed more stably.

Therefore, power for driving the driving indicator 210 may be reduced, and, as a result, driving efficiency of the information output apparatus 200 may be improved.

Then, when an attractive force to pull the driving indicator 210 in the direction opposite to the first direction, is applied again, the driving indicator 210 may rotate.

For example, when an attractive force is applied to the driving indicator 210 to bring the driving indicator 210 close to the coil 220, the protrusion 215 may be arranged in the first region 235A through a curved surface of the side surface 215A of the protrusion 215 and a curved surface of the second region 235B of the driving groove 235 or curved surfaces of the first region 235A and the second region 235B, thereby facilitating rotation of the driving indicator 210.

Then, even when the attraction is continuously applied or the attractive force is removed in some embodiments, the driving indicator 210 may move in the direction opposite to the first direction, e.g., downward direction toward the coil 220, and be again in the state same as that of FIG. 4.

Figure 6:
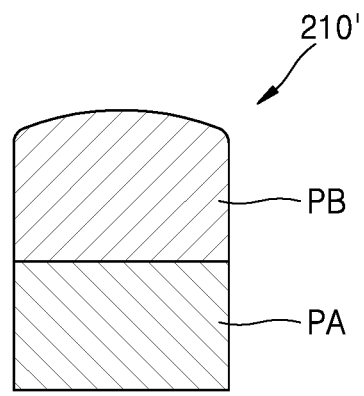
FIGS. 6 and 7 are diagrams showing modified examples of a driving indicator.
Figure 7:
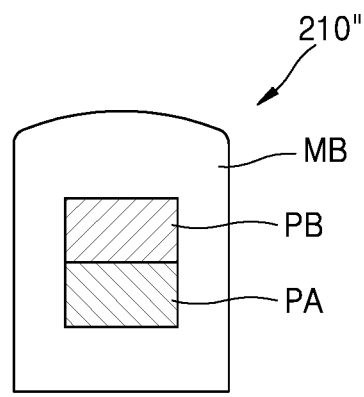

FIGS. 6 and 7 are diagrams showing modified examples of a driving indicator.

Referring to FIG. 6, a driving indicator 210' may include a first magnetic portion PA and a second magnetic portion PB. The first magnetic portion PA and the second magnetic portion PB may polarities different from each other. For example, the first magnetic portion PA may be have an N polarity, and the second magnetic portion PB may have an S polarity. In another example, the first magnetic portion PA may have the S polarity, and the second magnetic portion PB may have the N polarity.

In another example, referring to FIG. 7, a driving indicator 210''' may include the first magnetic portion PA, the second magnetic portion PB, and a cover layer MB.

The first magnetic portion PA and the second magnetic portion PB may polarities different from each other. For example, the first magnetic portion PA may be have an N polarity, and the second magnetic portion PB may have an S polarity. In another example, the first magnetic portion PA may have the S polarity, and the second magnetic portion PB may have the N polarity.

The cover layer MB may cover at least one surface of each of the first magnetic portion PA and the second magnetic portion PB. In detail, the cover layer MB may be formed to surround the first magnetic portion PA and the second magnetic portion PB. Therefore, the cover layer MB may protect the first magnetic portion PA and the second magnetic portion PB, and the cover layer MB may include various materials. For example, the cover layer MB may include an organic layer or an inorganic layer. In detail, the cover layer MB may include an organic material like a resin or an inorganic material like a ceramic.

The driving indicators of FIGS. 6 and 7 may be selectively applied to the information output apparatus of FIGS. 1 and 4 described above.

Figure 8:
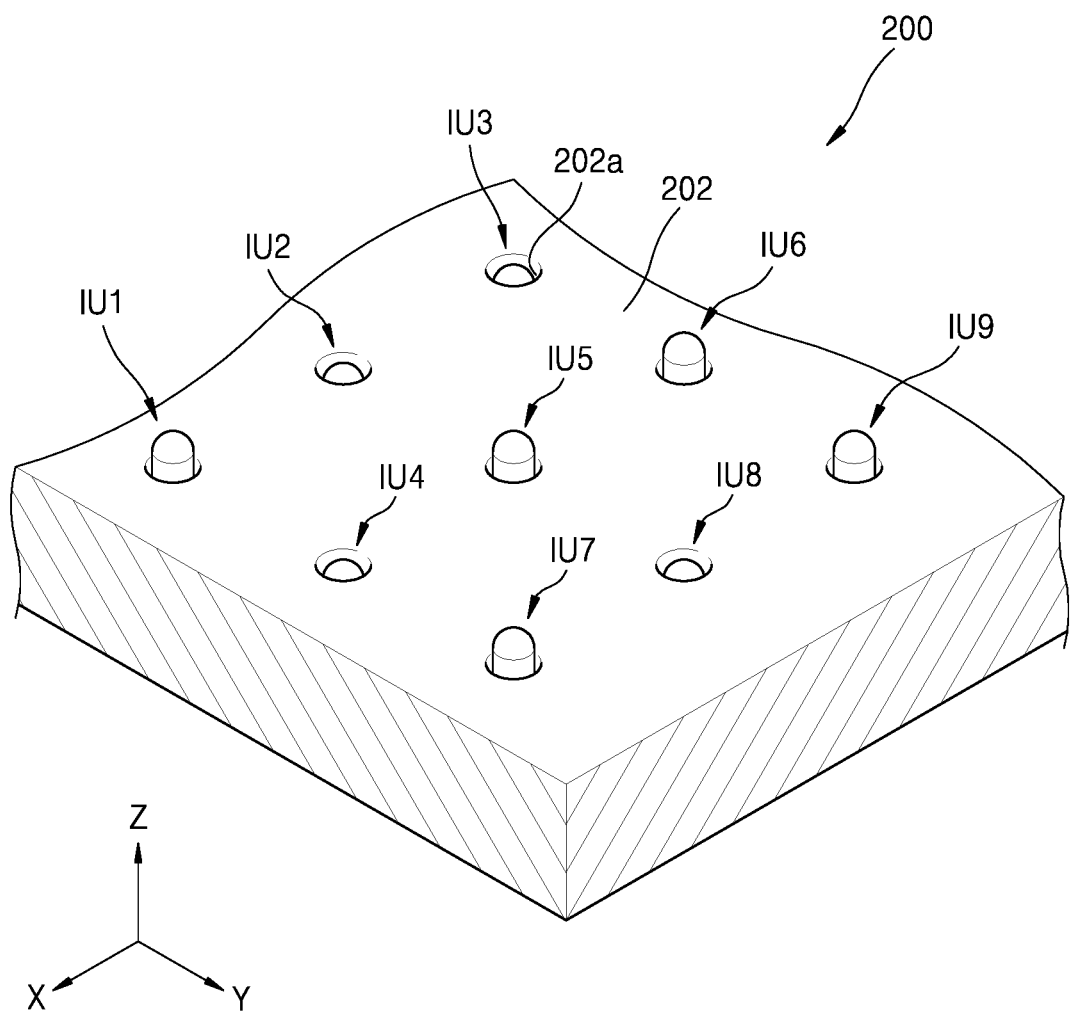
FIG. 8 is a schematic perspective view of an information output apparatus according to another embodiment of the present disclosure.

FIG. 8 is a schematic perspective view of an information output apparatus according to another embodiment of the present disclosure.

Referring to FIG. 8, the information output apparatus 200 according to the present embodiment includes a plurality of information output units IU1, IU2, . . . , and IU9.

Although FIG. 8 shows nine information output units, the information output apparatus 200 may include various numbers of information output units according to embodiments.

In other words, the information output apparatus 200 may include various numbers of information output units according to purposes, characteristics of applied products, and user characteristics.

Meanwhile, the information output apparatus 200 may include a housing 202 to protect the plurality of information output units IU1, IU2, . . . , and IU9, and the housing 202 may include via holes 202a corresponding to respective information output units.

Description of the information output units is identical to the descriptions in the above-described embodiments and will be omitted.

The base units 130 and 230 in the above-described embodiment may have a long shape extended to correspond to at least a plurality of information output units. In another example, the base units 130 and 230 may be integrally formed to correspond to all of a plurality of information output.

In detail, the base units 130 and 230 may be formed to include a plurality of first accommodating units and a second accommodating units for accommodating coils and driving indicators included in the respective information output units and to be connected to each other.

The information output apparatus according to the present embodiment may include one or more information output units, and driving indicators of the one or more information output unit may move at least in the first direction or the direction opposite thereto. Various information that may be sensed by a user may be output through the driving indicators.

For example, the information output apparatus according to the present exemplary embodiment may be a tactile sensing type information output apparatus that a user may recognize a protrusion of a driving indicator through a tactile sense. More particularly, information may be output in the form of Braille output.

In some embodiment, the information output apparatus may be a visually-sensing type information output apparatus that a user may visually recognize a protrusion of a driving indicator. Particularly, when a color is formed on one surface of the driving indicator, for example, the top surface, or when light is emitted from one surface of the driving indicator, the visual recognition effect may be increased.

Accordingly, the information output apparatus according to the present embodiment may output information to a user. In some embodiments, the information output apparatus according to the present embodiment may output various information to a user when the information output apparatus includes a plurality of information output units.

Also, in detail, a driving indicator may be easily moved in the first direction by a magnetic field generated by a coil (e.g., upward movement) and may be moved in the second direction by a protrusion and a driving groove of the driving indicator (e.g., clockwise rotation).

Also, the rotation may be restricted as a fixing portion of the protrusion is supported by a locking hook of the driving groove. Therefore, a state in which protrusion of the driving indicator is low (e.g., an OFF state) may be easily maintained.

Then, when force is applied to the driving indicator in the direction opposite to the first direction, the driving indicator may be rotated by the protrusion and the driving groove of the driving indicator, e.g., rotation in the counterclockwise direction, and, even when the force is continuously applied or the force is removed, the driving indicator may move in the direction opposite to the first direction, e.g., moving downward. Also, further rotation may be restricted as a fixing portion of the protrusion is supported by a locking hook of the driving groove. Also, the protruding state (e.g., the ON state) of the driving indicator may be maintained.

Accordingly, the ON state and the OFF state of the driving indicator may be easily switched and maintained, power consumption for the movement of the driving indicator may be reduced, and the overall energy efficiency of an information output apparatus may be improved.

Figure 9:
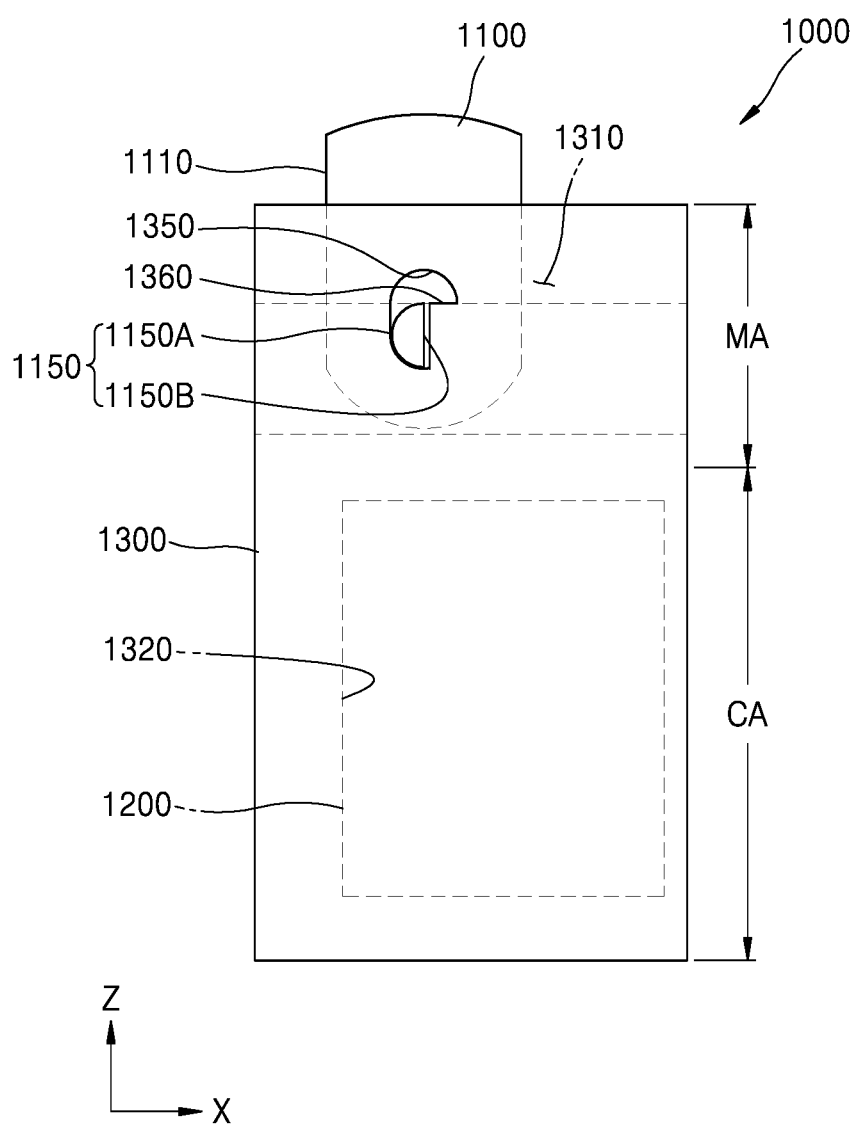
FIG. 9 is a schematic perspective front view of an information output apparatus according to another embodiment of the present disclosure.
Figure 10:
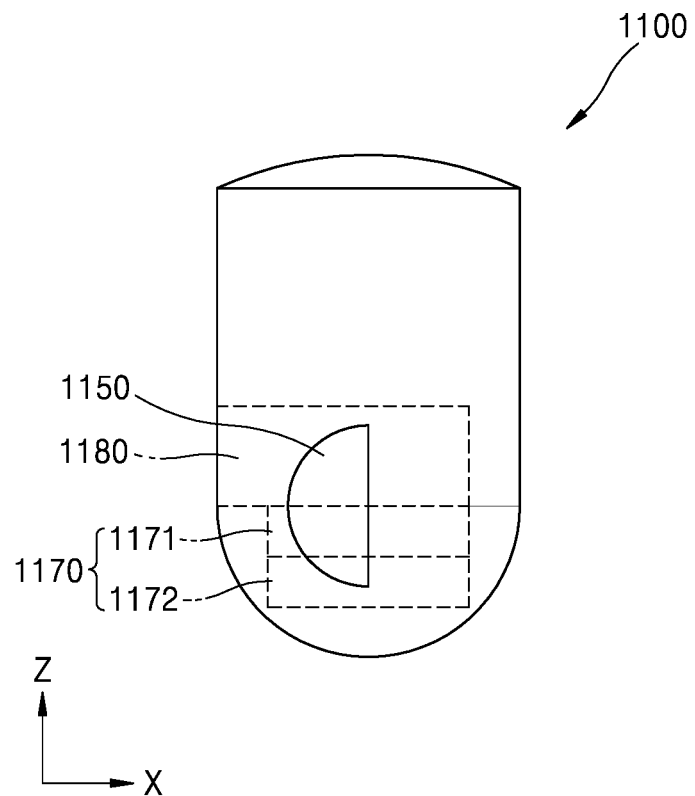
FIG. 10 is an enlarged view of a driving indicator of FIG. 9.
Figure 11:
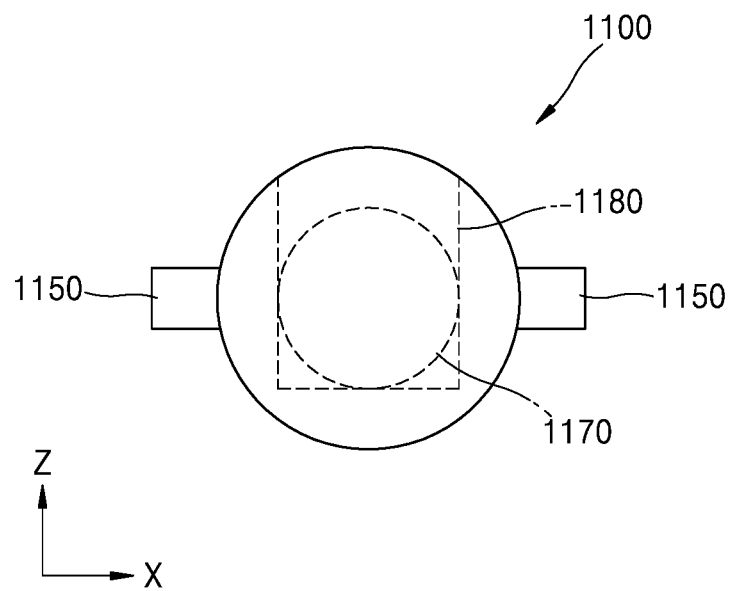
FIG. 11 is a perspective plan view of the driving indicator of FIG. 9.

FIG. 9 is a schematic perspective front view of an information output apparatus according to an embodiment of the present disclosure, FIG. 10 is an enlarged view of a driving indicator of FIG. 9, and FIG. 11 is a perspective view of the driving indicator of FIG. 9 viewed from above.

Figure 12:
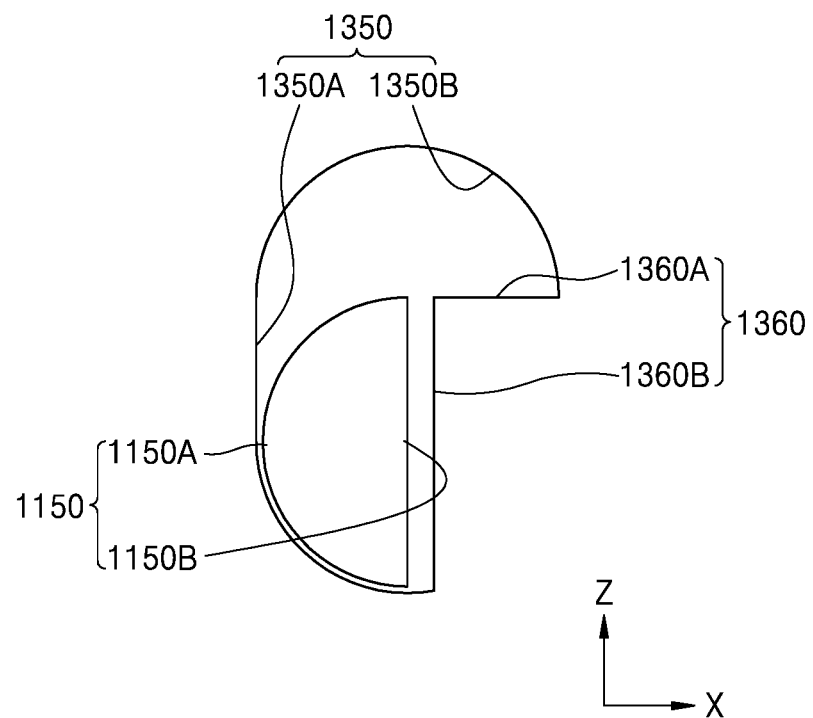
FIG. 12 is an enlarged view of a portion of FIG. 9.

FIG. 12 is an enlarged view of a portion of FIG. 9. In detail, FIG. 12 is an enlarged view of a protrusion of a driving indicator and a driving groove of a base unit of FIG. 9.

Referring to FIGS. 9 to 12, an information output apparatus 1000 of the present embodiment includes at least one information output unit, and FIG. 9 shows one information output unit. In other words, the information output apparatus 1000 of FIG. 9 may be a single information output unit.

Although FIG. 9 shows the one information output unit, the information output apparatus 1000 may include two, three, or more information output units according to some embodiments.

In other words, the information output apparatus 1000 may include various numbers of information output units according to purposes, characteristics of applied products, and user characteristics.

For convenience of explanation, an information output apparatus including one information output unit as shown in FIG. 9 will be described.

The information output apparatus 1000 may include a driving indicator 1100, a coil 1200, and a base unit 1300.

The driving indicator 1100 may be moved by a magnetic field generated by a current flowing in the coil 1200.

The driving indicator 1100 may include a material having magnetic properties.

The driving indicator 1100 will be described in detail with reference to FIGS. 10 and 11.

The driving indicator 1100 may include a magnetic portion 1170 and a magnetic body 1180.

According to some embodiments, the magnetic portion 1170 may include a magnetic material and may include, for example, a permanent magnet.

The magnetic portion 1170 may include a first magnetic portion 1171 and a second magnetic portion 1172. In detail, the first magnetic portion 1171 and the second magnetic portion 1172 may have different polarities from each other. For example, the first magnetic portion 1171 may have the N polarity, and the second magnetic portion 1172 may have the S polarity. In another example, the first magnetic portion 1171 may have the S polarity, and the second magnetic portion 1172 may have the N polarity.

The magnetic body 1180 has a property of being magnetized by a magnetic field. For example, the magnetic body 1180 may be arranged close to the magnetic portion 1170, magnetized by the magnetic portion 1170, and influences the direction of a magnetic field generated by the magnetic portion 1170.

In some embodiments, the magnetic body 1180 may include various materials. For example, the magnetic body 1180 may include iron. In another example, the magnetic body 1180 may include nickel or cobalt.

The magnetic body 1180 may be tilted at a predetermined angle with respect to the magnetic portion 1170.

In some embodiments, the magnetic portion 1170 and the magnetic body 1180 may be arranged to be eccentric with each other. For example, the center axis of the magnetic portion 1170 and the center axis of the magnetic body 1180 may not be aligned with each other.

In some embodiments, as shown in FIGS. 10 and 11, the magnetic portion 1170 may be arranged in the central region of the driving indicator 1100, and the magnetic body 1180 may extend in the central region of the driving indicator 1100 toward the outer surface of the driving indicator 1100.

In some embodiments, one side surface of the magnetic body 1180 may be exposed to one side surface of the driving indicator 1100. Therefore, a configuration in which the magnetic body 1180 is provided inside the driving indicator 1100 may be easily implemented.

In some embodiments, the center axis of the magnetic portion 1170 may be parallel to the center axis of the driving indicator 1100, whereas the center axis of the magnetic body 1180 may not be parallel with the center axis of the driving indicator 1100.

As the center axis of the magnetic portion 1170 and the center axis of the magnetic body 1180 are eccentric with each other, an axial direction of a magnetic field generated by a combination of the coil 1200, the magnetic portion 1170, and the magnetic body 1180 or a magnetic axis-wise direction of the driving indicator 1100 may not be parallel to the center axis of the driving indicator 1100 and may be tilted at a predetermined angle. Therefore, the torque of the driving indicator 1100 may be easily generated, and the movement of the driving indicator 1100 may be smoothly controlled to improve the indication precision of the information output apparatus 1000 and reduce power consumption thereof.

The driving indicator 1100 may perform a rotational movement, for example, an angular movement at a predetermined angle.

The driving indicator 1100 may move to protrude in one direction and may change a position thereof by moving up and down in at least the lengthwise direction of the driving indicator 1100. Therefore, the driving indicator 1100 may move to protrude in one direction, and a user may sense the movement of the driving indicator 1100 tactilely or visually.

The driving indicator 1100 may include a protrusion 1150 protruding from a side surface of the major main body region 1110.

Although not shown in FIGS. 9 and 10, in some embodiments, as shown in FIG. 11, the driving indicator 1100 may include two protrusions 1150 protruding from both side surfaces of the major main body region 1110 facing each other.

Referring to FIG. 12, the protrusion 1150 may include a side surface 1150A having at least a curved region and a fixing portion 1150B.

The fixing portion 1150B may have a flat surface in at least one region.

In some embodiments, the major main body region 1110 of the driving indicator 1100 may have a long extended pillar-like shape.

In this case, an end portion of the driving indicator 1100 may have a curved surface, and edges of the driving indicator 1100 may be rounded.

For example, an end portion of the driving indicator 1100 facing a user, which is a protruding region of the driving indicator 1100, may have a curved surface.

Also, a bottom surface 1120 of the driving indicator 1100, that is, a surface opposite to the end portion of the driving indicator 1100, which is a protruding region of the driving indicator 1100, may also include a curved surface. In other words, the bottom surface 1120 becomes narrower in the downward direction, and thus the magnetic portion 1170 may be stably arranged. For example, the magnetic portion 1170 may be arranged in parallel with the center axis of the driving indicator 1100.

The protrusion 1150 of the driving indicator 1100 may be formed to be adjacent to an end portion opposite to an end portion of a side surface region of the major main body region 1110 of the driving indicator 1100 (i.e., an end portion protruding toward a user in the lengthwise direction of the driving indicator 1100).

The driving indicator 1100 may be arranged in a first accommodating unit 1310 of a base unit 1300 to be described below.

A coil 1200 may be arranged to be adjacent to the driving indicator 1100. Also, the coil 1200 may be arranged in a second accommodating unit 1320 of the base unit 1300 to be described below.

A power supply unit (not shown) may be connected to the coil 1200, and, when a current flows in the coil 1200, a magnetic field may be formed around the coil 1200.

The coil 1200 may have various shapes. For example, the coil 1200 may have a shape in which a plurality of circuit wires are wound, and the number of times that the circuit wires are wound may be variously adjusted.

Due to a magnetic field generated by a current flowing in the coil 1200, repulsive force or attractive force may occur between the coil 1200 and the driving indicator 1100, and thus the driving indicator 1100 may be moved by the repulsive force or the attractive force.

In some embodiments, the coil 1200 may be arranged to be apart from the driving indicator 1100, and the driving indicator 1100 may be arranged to face a side of the coil 1200 in one direction.

The base unit 1300 may be formed to accommodate the driving indicator 1100 and the coil 1200.

In some embodiments, the base unit 1300 may include a first region CA corresponding to the coil 1200 and a second region MA corresponding to the driving indicator 1100, and the second region MA may be adjacent to the first region CA. For example, the first region CA and the second region MA of the base unit 1300 may be connected to each other without overlapping each other.

In detail, the base unit 1300 may include the first accommodating unit 1310 and the second accommodating unit 1320.

The first accommodating unit 1310 may include a space for accommodating the driving indicator 1100. The first accommodating unit 1310 may be a space formed by removing a portion of the base unit 1300 having a predetermined width and a predetermined length. The first accommodating unit 1310 may be open to at least one surface of the base unit 1300. Through this, the driving indicator 1100 accommodated in the first accommodating unit 1310 may protrude from the first accommodating unit 1310 while being accommodated in the first accommodating unit 1310.

In some embodiments, the first accommodating unit 1310 may be open to the top surface of the base unit 1300 and one side surface connected thereto.

The length of the first accommodating unit 1310 may be at least corresponding to or greater than the length of the driving indicator 1100. Therefore, the driving indicator 1100 may be accommodated in the first accommodating unit 1310 not only when the driving indicator 1100 moves in a first direction, e.g., upward, and moves in an opposite direction, that is, downward, but also when the driving indicator 1100 moves in a second direction crossing the first direction (e.g., when the driving indicator 1100 is rotated by 90 degrees and is positioned horizontally).

The second accommodating unit 1320 may include a space for accommodating the coil 1200. The second accommodating unit 1320 may accommodate the coil 1200, and the second accommodating unit 1320 may be distinguished from the first accommodating unit 1310. For example, the first accommodating unit 1310 and the second accommodating unit 1320 may be arranged apart from each other and not connected to each other.

Therefore, the coil 120 and the driving indicator 1100 may be separated spatially.

In some embodiments, the coil 1200 may be accommodated in the second accommodating unit 1320 and surrounded by the base unit 1300. In another example, the coil 1200 may be surrounded by the base unit 1300 except for a region of the coil 1200 connected to an external power supply unit (not shown).

The base unit 1300 may include a driving groove 1350 and a locking hook 1360.

The driving groove 1350 may be formed to be connected to the first accommodating unit 1310. The protrusion 1150 of the driving indicator 1100 may correspond to the driving groove 1350.

For example, when the driving indicator 1100 is arranged (accommodated?) in the first accommodating unit 1310, the protrusion 1150 of the driving indicator 1100 may correspond to the driving groove 1350.

FIGS. 9 and 12 show that the driving groove 1350 has a shape penetrating through the side surface of the base unit 1300. Although not shown, the driving groove 1350 may be connected to the first accommodating unit 1310 and may not penetrate through the side surface of the base unit 1300. In other words, the driving groove 1350 may have a groove shape instead of a penetrating shape.

The driving groove 1350 may include a first region 1350A and a second region 1350B. The first region 1350A may be arranged closer to the second accommodating unit 1320 than the second region 1350B.

The first region 1350A may be formed to support the protrusion 1150 when the driving indicator 1100, for example, the protrusion 1150 of the driving indicator 1100 is closest to the coil 1200.

To this end, the first region 1350A may have an edge surface similar to that of a side surface 1150A of the protrusion 1150 of the driving indicator 1100, and for example, the first region 1350A may have a curved surface.

Also, the first region 1350A may have an appropriate width to facilitate the movement of the driving indicator 1100 in the first direction, that is, the direction away from the coil 1200, and in the opposite direction. Also, the first region 1350A may be formed to extend in the first direction to be connected to the second region 1350B.

The second region 1350B is connected to the first region 1350A and may have a shape extending in the second direction crossing the first direction. As described above, the first direction is a direction in which the driving indicator 1100 moves away from the coil 1200 and is the Z-axis direction in FIGS. 9, 10, and 12.

In some embodiments, the second direction may be a direction orthogonal to the first direction, e.g., the X-axis direction in FIGS. 9, 10, and 12.

For convenience of explanation, the first direction and the second direction will be used as having the same meanings in the descriptions below.

The second region 1350B may be formed to correspond to the protrusion 1150 when the driving indicator 1100 moves in the first direction and then moves in the second direction.

In other words, when the driving indicator 1100 is rotated, the protrusion 1150 may rise from the first region 1350A, be rotated by a predetermined angle, and arranged in the second region 1350B.

The second region 1350B may have a shape corresponding to a state in which the protrusion 1150 is arranged by being rotated, and may have, for example, a curved surface.

Also, the second region 1350B may have an appropriate width to facilitate the downward movement of the driving indicator 1100 in the direction opposite to the first direction, e.g., downward movement after being rotated, after the driving indicator 1100 returns in the second direction.

Also, the second region 1350B may have a shape similar to a state that the first region 1350A is rotated.

The base unit 1300 may include a locking hook 1360 to maintain the state after the driving indicator 1100 is arranged in the second region 1350B. The locking hook 1360 includes a top surface 1360A and a side surface 1360B. The top surface 1360A and the side surface 1360B of the locking hook 1360 are connected to each other and may correspond to the fixing portion 1150B of the protrusion 1150 according to the movement of the driving indicator 1100.

In other words, in the state shown in FIG. 9, when there is no external force applied to the fixing portion 1150B of the protrusion 1150 of the driving indicator 1100, the movement, e.g., rotation, of the fixing portion 1150B may be restricted by the side surface 1360B of the locking hook 1360.

Also, when the protrusion 1150 corresponds to the second region 1350B of the driving groove 1350 as the driving indicator 1100 moves, the movement of the fixing portion 1150B of the protrusion 1150 may be restricted by the top surface 1360A of the locking hook 1360.

FIGS. 13A to 13D are diagrams for describing the operation of the information output apparatus of FIG. 9.

The operation of the information output apparatus will be described by sequentially referring to FIGS. 13A to 13D.

Figure 13A:
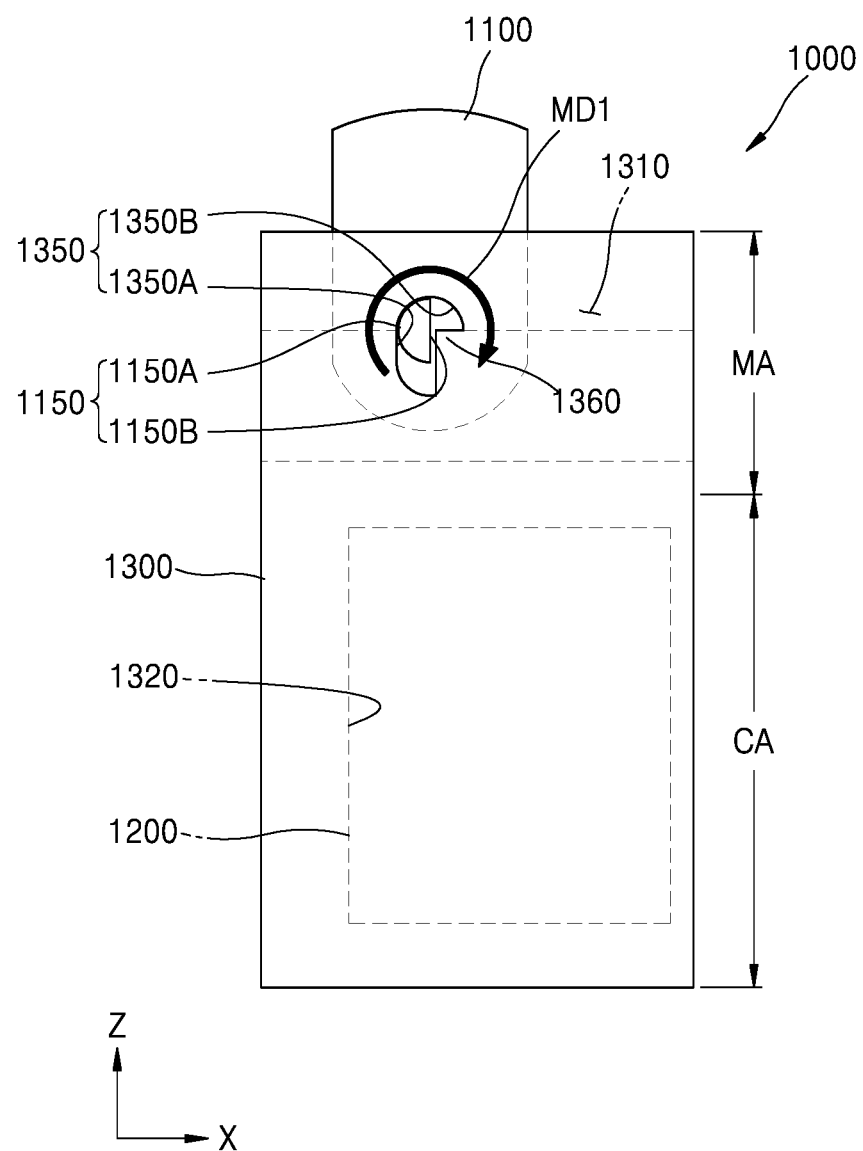
FIGS. 13A to 13D are diagrams for describing the operation of the information output apparatus of FIG. 9.

FIG. 13A shows a state that the driving indicator 1100 of the information output apparatus 1000 is elevated as compared to the state shown in FIG. 9. In other words, the driving indicator 1100 has moved upward in the first direction, and, compared to FIG. 9, the driving indicator 1100 may be arranged to be farther away from the coil 1200.

The movement of the driving indicator 1100 may be caused by a magnetic field generated by a current flowing in the coil 1200, and the driving indicator 1100 may move by receiving a repulsive force from the magnetic field generated around the coil 1200 according to the polarity of the magnetic portion 1170 included in the driving indicator 1100.

At this time, the driving indicator 1100 may move while the protrusion 1150 of the driving indicator 1100 is connected to the driving groove 1350 of the base unit 1300.

In detail, the protrusion 1150 may rise in the first direction from the first region 1350A of the driving groove 1350 and reach a point at which the protrusion 1150 is unable to move further in the first direction due to the edge of the second region 1350B in the first region 1350A, that is, a highest point, and thus the driving indicator 1100 may also reach a highest point in the first direction.

Figure 13B:
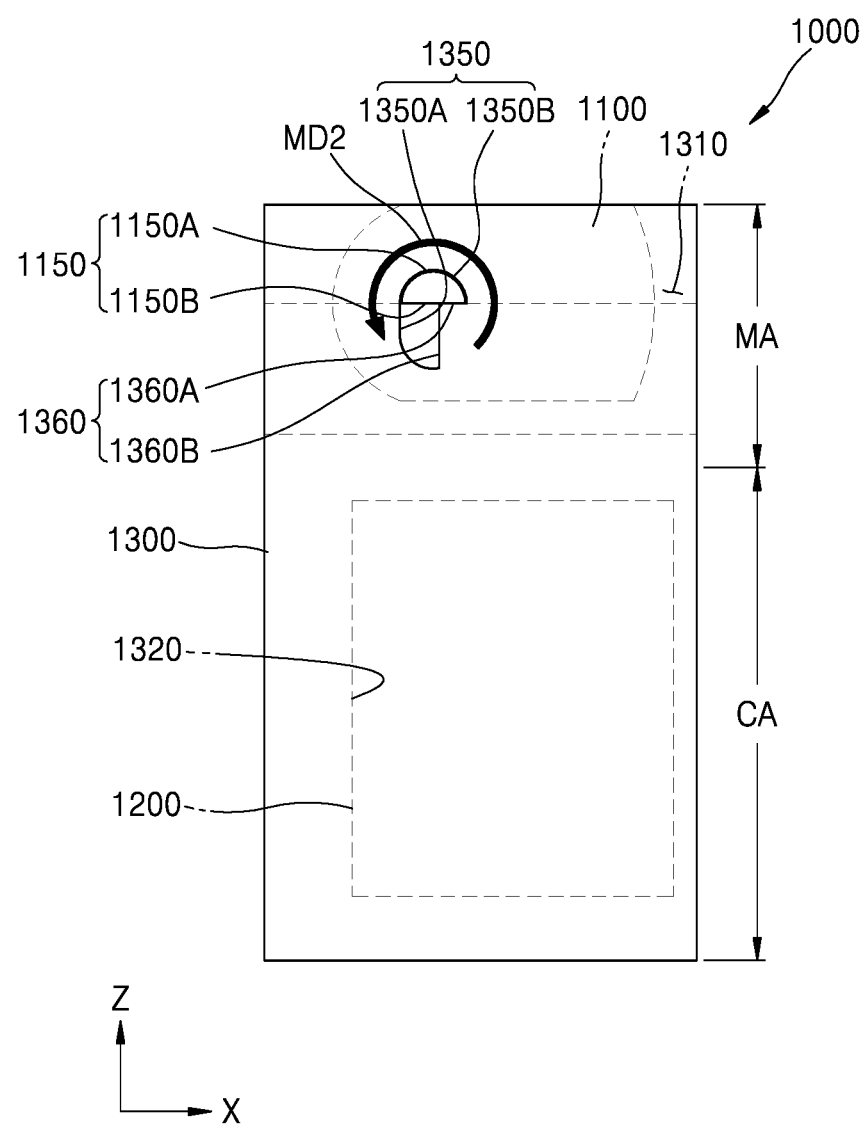

FIG. 13B shows a state in which the driving indicator 1100 is rotated in a direction MD1 of FIG. 13A from the state shown in FIG. 13A.

As a result, an end portion of the driving indicator 1100 in the first direction may face the second direction crossing the first direction instead of facing the first direction. Here, in some embodiments, the second direction may be orthogonal to the first direction.

In some embodiments, the driving indicator 1100 may be arranged to not to be past the top surface of the base unit 1600 after the movement. In other words, the entire regions of the driving indicator 1100 may be accommodated in the first accommodating unit 1310 of the base unit 1600, and thus the driving indicator 1100 may not be past the first accommodating unit 1310.

When force in the first direction is transmitted to the driving indicator 1100 by the magnetic field due to the coil 1200 in the state of FIG. 13A (i.e., when repulsive force is applied), the protrusion 1150 is arranged in the second region 1350B of the driving groove 1350 by the curved surface of the protrusion 1150 and the curved surface of the second region 1350B or the curved surfaces of the first region 1350A and the second region 1350A, thereby facilitating rotation of the driving indicator 1100.

At this time, as the magnetic axis-wise direction of the magnetic field generated in the driving indicator 1100 is not parallel with the center axis of the driving indicator 1100, the magnetic portion 1170 and the magnetic body 1180 may be arranged to be eccentric with each other, for example. In detail, the center axis of the magnetic portion 1170 and the center axis of the magnetic body 1180 may not be parallel to each other.

Therefore, the torque of the driving indicator 1100 may be easily generated, and the movement of the driving indicator 1100 may be smoothly controlled to improve the indication precision of the information output apparatus 1000 and reduce power consumption thereof.

In some embodiments, the state of FIG. 13B may be recognized by a user as an OFF state of the driving indicator 1100, and the state of FIG. 9 or 13A opposite to the OFF state may be recognized as an ON state of the driving indicator 1100.

The state of FIG. 13B may be maintained without applying a separate force to the driving indicator 1100. In other words, the protrusion 1150 of the driving indicator 1100 may be kept fixed by the locking hook 1360. In detail, the fixing portion 1150B of the protrusion 1150 may be arranged on the top surface 1360A of the locking hook 1360, and, since both the fixing portion 1150B and the top surface 1360A of the locking hook 1360 have flat surfaces, the protrusion 1150 may be fixed more stably.

Therefore, power for driving the driving indicator 1100 may be reduced, and, as a result, driving efficiency of the information output apparatus 1000 may be improved.

Also, even when force (e.g., repulsive force) is applied to the driving indicator 1100 in the first direction, the state of FIG. 13B may be easily maintained.

Figure 13C:
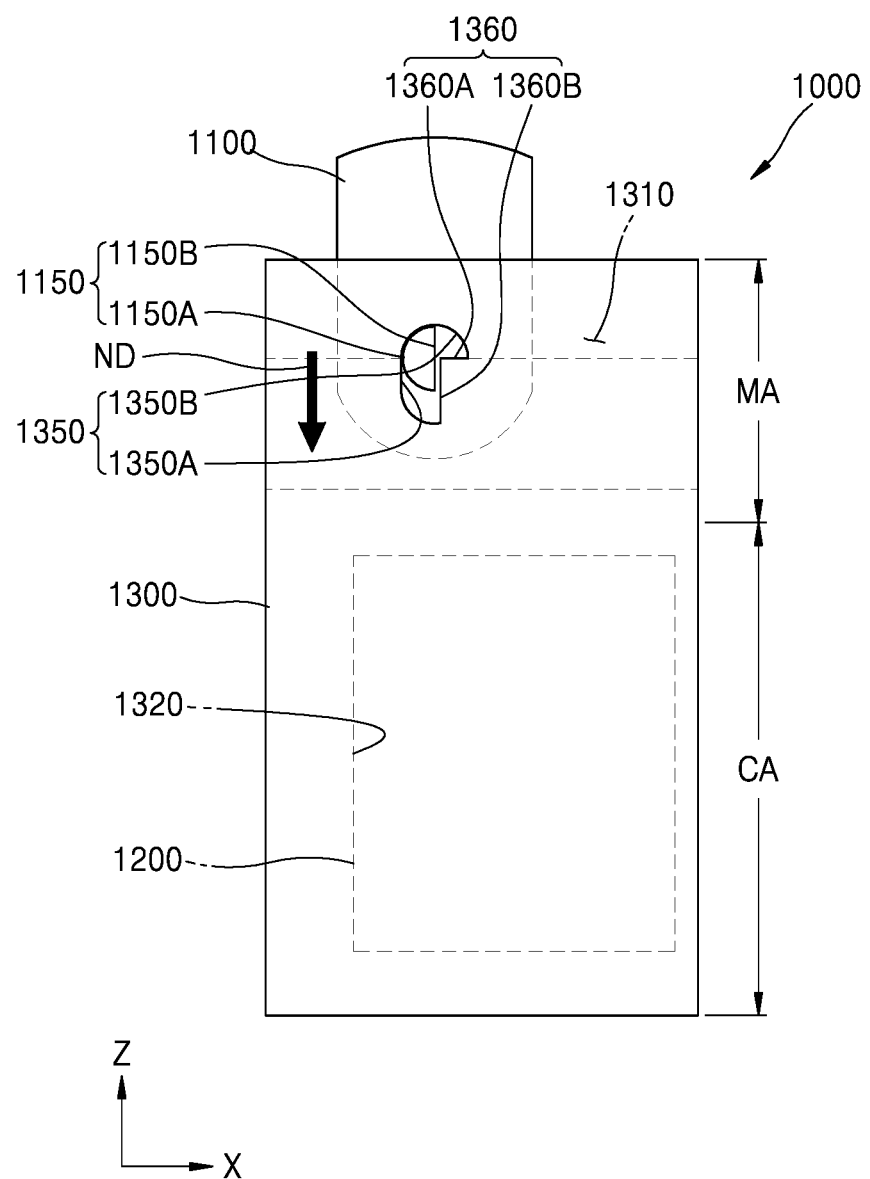

Next, FIG. 13C shows a state in which the driving indicator 1100 is rotated in a direction MD2 of FIG. 13B from the state shown in FIG. 13B. In other words, FIG. 3C shows a state which the driving indicator 110 is rotated in a direction opposite to the direction MD1 described above.

Therefore, the driving indicator 1100 is in a state same as that shown in FIG. 13A.

The movement of the driving indicator 1100 rotating in the direction MD2 shown in FIG. 13B into the state of FIG. 13C may be caused by force for moving the driving indicator 1100 in a direction opposite to the first direction, that is, force for moving the driving indicator 1100 downward.

In detail, the movement of the driving indicator 1100 from the state of FIG. 13B to the state of FIG. 13C may be caused by a magnetic field generated by a current flowing in the coil

1200. For example, the driving indicator 1100 may move by receiving attracting force from the magnetic field generated around the coil 1200 according to the polarity of the magnetic portion 1170 included in the driving indicator 1100.

For example, in the state shown in FIG. 13B, when force in a direction opposite to the first direction, that is, force for moving the driving indicator 1100 close to the coil 1200 (e.g., attractive force) is applied to the driving indicator 1100 by the magnetic field due to the coil 1200, the protrusion 1150 is arranged in the first region 1350A by the curved surface of the side surface 1150A of the protrusion 1150 and the curved surface of the second region 1350B of the driving groove 1350 or the curved surfaces of the first region 1350A and the second region 1350B, thereby facilitating rotation of the driving indicator 1100 in the direction MD2.

Figure 13D:
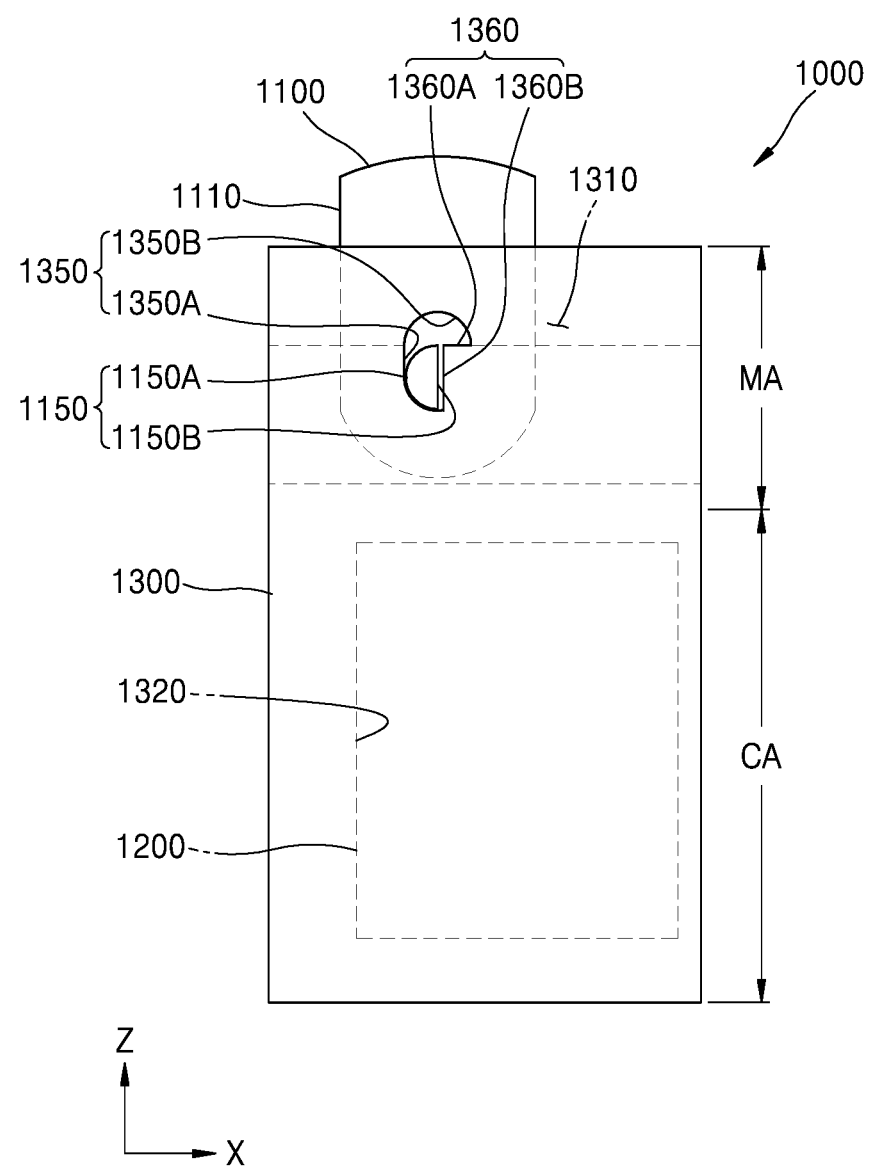

Next, FIG. 13D shows a state that the driving indicator 1100 is moved in a direction ND of FIG. 13C from the state of FIG. 13C.

In other words, the driving indicator 1100 may move in a direction opposite to the first direction from the state of FIG. 13C, e.g., a downward direction toward the coil 1200, and may be arranged as shown in FIG. 9.

The movement from the state of FIG. 13C to the state of FIG. 13D may be caused by the force applied to the driving indicator 1100 in FIG. 13C, that is, the force for moving the driving indicator 1100 in the direction opposite to the first direction (e.g., force to move the driving indicator 1100 downward). In detail, the movement may be caused by force applied to the driving indicator 1100 by the magnetic field generated by the coil 1200.

Also, in some embodiments, even when no separate force is applied in the state of FIG. 13C, the driving indicator 1100 may move downward due to the gravity and be arranged in the state of FIG. 13D.

Also, in this case, the movement of the driving indicator 1100 may be controlled as long as a predetermined force is not transmitted to the driving indicator 1100 in the first direction. For example, the movement or the rotation of the driving indicator 1100 in the second direction may be controlled by the side surface 1360B of the locking hook 1360 of the base unit 1300.

In some embodiments, the side surface 1360B of the locking hook 1360 may have a flat surface.

The information output apparatus according to the present embodiment may include one or more information output units, and driving indicators of the one or more information output unit may move at least in the first direction or the direction opposite thereto. Various information that may be sensed by a user may be output through the driving indicators.

For example, the information output apparatus according to the present exemplary embodiment may be a tactile sensing type information output apparatus that a user may recognize a protrusion of a driving indicator through a tactile sense. More particularly, information may be output in the form of Braille output.

In some embodiment, the information output apparatus may be a visually-sensing type information output apparatus that a user may visually recognize a protrusion of a driving indicator. Particularly, when a color is formed on one surface of the driving indicator, for example, the top surface, or when light is emitted from one surface of the driving indicator, the visual recognition effect may be increased.

Accordingly, the information output apparatus according to the present embodiment may output information to a user. In some embodiments, the information output apparatus according to the present embodiment may output various information to a user when the information output apparatus includes a plurality of information output units.

Also, in detail, a driving indicator may be easily moved in the first direction by a magnetic field generated by a coil (e.g., upward movement) and may be moved in the second direction by a protrusion and a driving groove of the driving indicator (e.g., clockwise rotation). Also, the rotation may be restricted as a fixing portion of the protrusion is supported by a locking hook of the driving groove. Therefore, a state in which protrusion of the driving indicator is low (e.g., an OFF state) may be easily maintained.

Then, when force is applied to the driving indicator in the direction opposite to the first direction, the driving indicator may be rotated by the protrusion and the driving groove of the driving indicator, e.g., rotation in the counterclockwise direction, and, even when the force is continuously applied or the force is removed, the driving indicator may move in the direction opposite to the first direction, e.g., moving downward. Also, further rotation may be restricted as a fixing portion of the protrusion is supported by a locking hook of the driving groove. Also, the protruding state (e.g., the ON state) of the driving indicator may be maintained.

Accordingly, the ON state and the OFF state of the driving indicator may be easily switched and maintained, power consumption for the movement of the driving indicator may be reduced, and the overall energy efficiency of an information output apparatus may be improved.

Also, the magnetic body provided in the driving indicator 1100 of the present embodiment may be tilted at a predetermined angle with respect to the magnetic portion.

In some embodiments, the magnetic portion and the magnetic body may be arranged to be eccentric with each other. For example, the center axis of the magnetic portion and the center axis of the magnetic body may not be parallel to each other.

Therefore, the magnetic axis-wise direction of the magnetic field in the driving indicator may not be parallel to the center axis of the driving indicator, thereby facilitating generation of torque with respect to the driving indicator and smoothly controlling the movement of the driving indicator to improve indication precision of the information output apparatus and reduce power consumption thereof.

In some embodiments, the center axis of the magnetic portion may be parallel to the center axis of the driving indicator, and the center axis of the magnetic body may not be parallel to the center axis of the driving indicator.

FIG. 14 is a diagram showing relative positions of a driving indicator and a coil of the information output apparatus of FIG. 9.

FIG. 14 shows that a center axis-wise direction C1 of the coil 1200 of the information output apparatus 1000 and a magnetic axis-wise direction C2 of the magnetic portion 1170 of the driving indicator 1100 are not parallel to each other.

Therefore, torque generation efficiency for the driving indicator 1100 may be improved.

Figure 15:
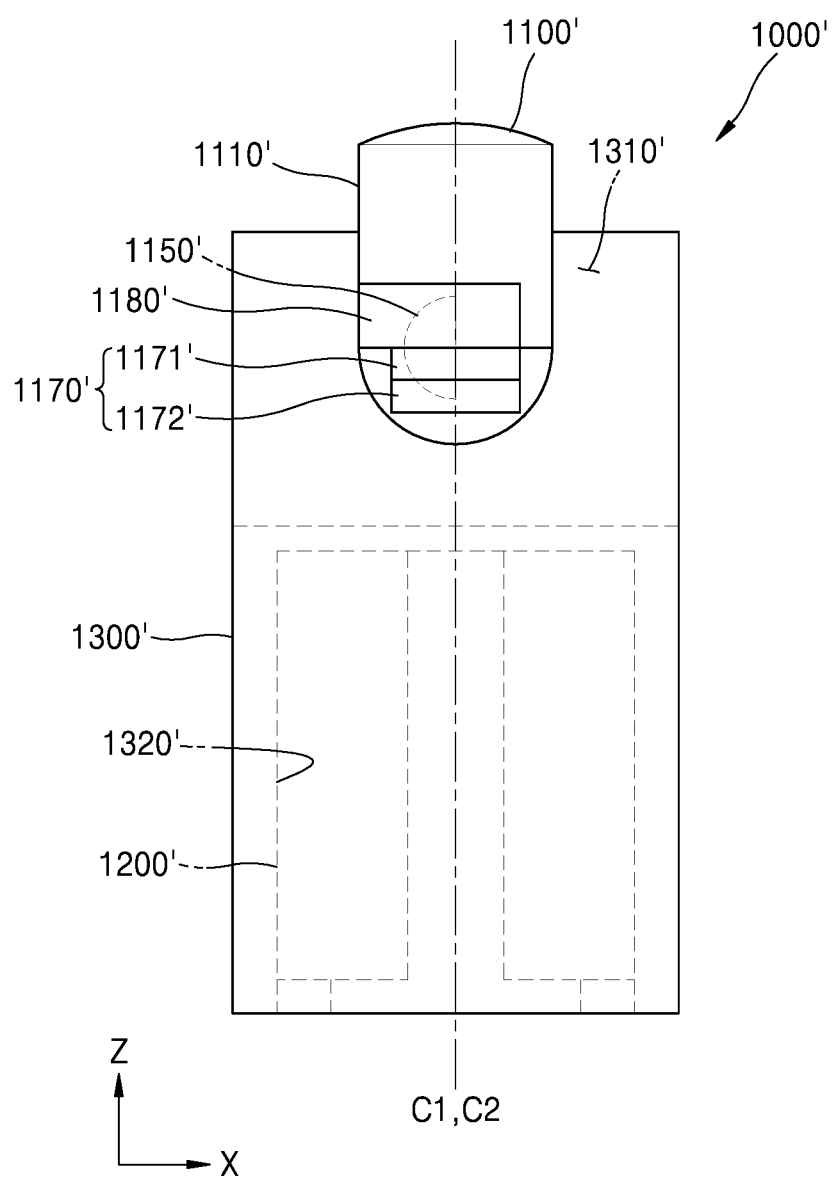
FIG. 15 is a diagram showing relative positions of a driving indicator and a coil of a modified example of the information output apparatus of FIG. 9.

FIG. 15 is a diagram showing relative positions of a driving indicator and a coil of a modified example of the information output apparatus of FIG. 9.

FIG. 15 shows that a center axis-wise direction C1 of a coil 1200' of an information output apparatus 1000' and a magnetic axis-wise direction C2 of a magnetic portion 1170' of a driving indicator 1100' are parallel to each other.

Therefore, spatial efficiency for accommodation of the driving indicator 1100 may be improved.

Figure 16:
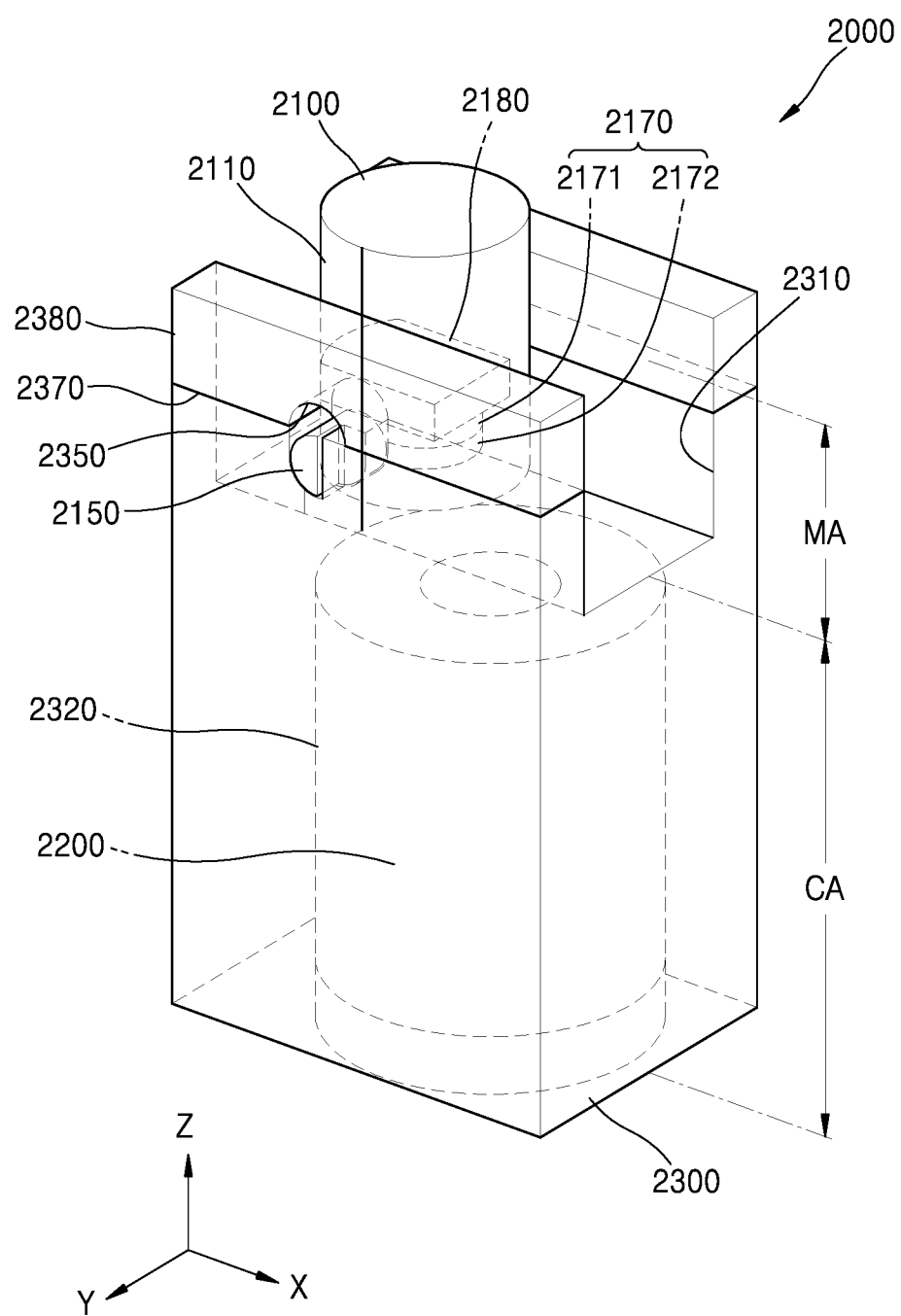
FIG. 16 is a schematic perspective view of an information output apparatus according to another embodiment of the present disclosure.
Figure 17:
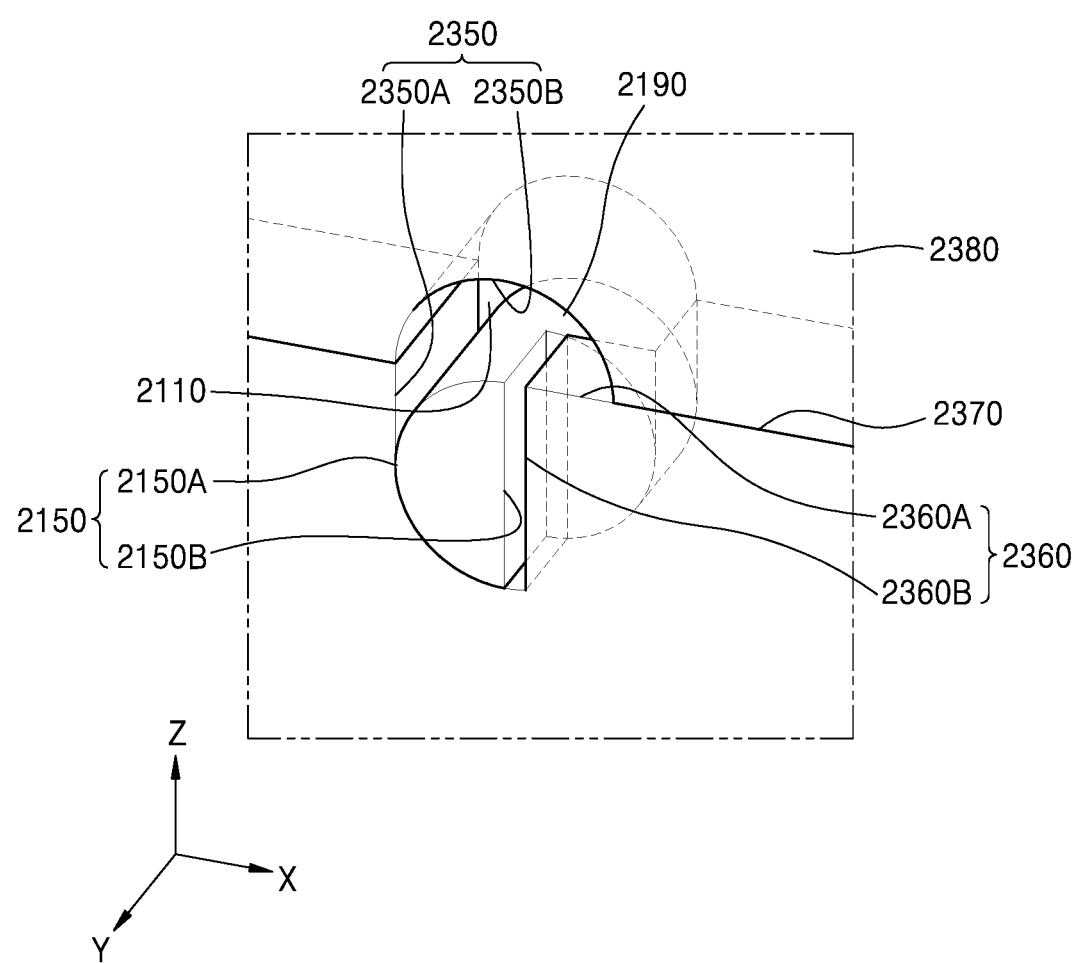
FIG. 17 is an enlarged view of a portion of FIG. 16.

FIG. 16 is a schematic perspective view of an information output apparatus according to another embodiment of the present disclosure, and FIG. 17 is an enlarged view of a portion of FIG. 16. In detail, FIG. 17 is an enlarged view of a protrusion of a driving indicator and a driving groove of a base unit of FIG. 16.

Referring to FIGS. 16 and 17, an information output apparatus 2000 of the present embodiment includes at least one information output unit, and one information output unit is shown. In other words, the information output apparatus 2000 of FIG. 16 may correspond to a single information output unit.

Although FIG. 16 shows the one information output unit, the information output apparatus 2000 may include two, three, or more information output units according to some embodiments.

In other words, the information output apparatus 2000 may include various numbers of information output units according to purposes, characteristics of applied products, and user characteristics.

For convenience of explanation, an information output apparatus including one information output unit as shown in FIG. 16 will be described.

The information output apparatus 2000 may include a driving indicator 2100, a coil 2200, and a base unit 2300.

The driving indicator 2100 may be moved by a magnetic field generated by a current flowing in the coil 2200 described below.

The driving indicator 2100 may include a material having magnetic properties.

The driving indicator 2100 may include a magnetic portion 2170 and a magnetic body 2180.

According to some embodiments, the magnetic portion 2170 may include a magnetic material and may include, for example, a permanent magnet.

The magnetic portion 2170 may include a first magnetic portion 2171 and a second magnetic portion 2172. In detail, the first magnetic portion 2171 and the second magnetic portion 2172 may have different polarities from each other. For example, the first magnetic portion 2171 may have the N polarity, and the second magnetic portion 2172 may have the S polarity. In another example, the first magnetic portion 2171 may have the S polarity, and the second magnetic portion 2172 may have the N polarity.

The magnetic body 2180 has a property of being magnetized by a magnetic field. For example, the magnetic body 2180 may be arranged close to the magnetic portion 2170, magnetized by the magnetic portion 2170, and influences the direction of a magnetic field generated by the magnetic portion 2170.

In some embodiments, the magnetic body 2180 may include various materials. For example, the magnetic body 2180 may include iron. In another example, the magnetic body 2180 may include nickel or cobalt.

The driving indicator 2100 may include a protrusion 2150 protruding from a side surface of the major main body region 2110. Although not shown, the driving indicator 2100 may include two protrusions 2150 protruding on both side surfaces of the major main body region 2110 facing each other.

In some embodiments, a protrusion connecting portion 2190 may be further included between the protrusion 2150 and the main body region 2110. The protrusion connecting portion 2190 may protrude from a side surface of the main body region 2110 and may have a width greater than that of the protrusion 2150. The protrusion connecting portion 2190 may be arranged at a location not caught by a locking hook 2360 of the base unit 2300 which will be described below.

The protrusion connecting portion 2190 is formed between the main body region 2110 and the protrusion 2150 of the driving indicator 2100 to have a width greater than that of the protrusion 2150, thereby distributing locally received force applied to the protrusion 2150 during rotational movement and restriction by the driving groove 2350 and the locking hook 2360 described below to reduce damages or deformation of the protrusion 2150 and to facilitate the rotation of the protrusion 2150.

The protrusion 2150 may include a side surface 2150A having at least a curved region and a fixing portion 2150B.

The fixing portion 2150B may have a flat surface in at least one region.

In some embodiments, the major main body region 2110 of the driving indicator 2100 may have a long pillar-like shape extending in one direction, that is, the lengthwise direction.

In this case, an end portion of the driving indicator 2100 may have a curved surface, and edges of the driving indicator 2100 may be rounded.

The protrusion 2150 of the driving indicator 2100 may be formed to be adjacent to an end portion opposite to an end portion of a side surface region of the major main body region 2110 of the driving indicator 2100 (i.e., an end portion protruding toward a user in the lengthwise direction of the driving indicator 2100).

The driving indicator 2100 may be arranged in a first accommodating unit 2310 of a base unit 2300 to be described below.

A coil 2200 may be arranged to be adjacent to the driving indicator 2100. Also, the coil 2200 may be arranged in a second accommodating unit 2320 of the base unit 2300 to be described below.

A power supply unit (not shown) may be connected to the coil 2200, and, when a current flows in the coil 2200, a magnetic field may be formed around the coil 2200.

The coil 2200 may have various shapes. For example, the coil 2200 may have a shape in which a plurality of circuit wires are wound, and the number of times that the circuit wires are wound may be variously adjusted.

The driving indicator 2100 may be moved by the magnetic field generated by a current flowing in the coil 2200.

In some embodiments, the coil 2200 may be arranged to be apart from the driving indicator 2100, and the driving indicator 2100 may be arranged to face a side of the coil 2200 in one direction.

The base unit 2300 may be formed to accommodate the driving indicator 2100 and the coil 2200.

In some embodiments, the base unit 2300 may include a first region CA corresponding to the coil 2200 and a second region MA corresponding to the driving indicator 2100, and the second region MA may be adjacent to the first region CA. For example, the first region CA and the second region MA of the base unit 2300 may be connected to each other without overlapping each other.

In detail, the base unit 2300 may include the first accommodating unit 2310 and the second accommodating unit 2320.

The first accommodating unit 2310 may include a space for accommodating the driving indicator 2100. The first accommodating unit 2310 may be a space formed by removing a portion of the base unit 2300 having a predetermined width and a predetermined length. The first accommodating unit 2310 may be open to at least one surface of the base unit 2300. Through this, the driving indicator 2100 accommodated in the first accommodating unit 2310 may protrude from the first accommodating unit 2310 while being accommodated in the first accommodating unit 2310.

In some embodiments, the first accommodating unit 2310 may be open to the top surface of the base unit 2300 and one side surface connected thereto.

The length of the first accommodating unit 2310 may be at least corresponding to or greater than the length of the driving indicator 2100. Therefore, the driving indicator 2100 may be accommodated in the first accommodating unit 2310 not only when the driving indicator 2100 moves in a first direction, e.g., upward, and moves in an opposite direction, that is, downward, but also when the driving indicator 2100 moves in a second direction crossing the first direction (e.g., when the driving indicator 2100 is rotated by 90 degrees and is positioned horizontally).

In some embodiments, the first accommodating unit 2310 may be open to one side surface of the base unit 2300 or a side surface of the base unit 2300 opposite thereto. In some other embodiments, the first accommodating unit 2310 may be open to both side surfaces of the base unit 2300.

The second accommodating unit 2320 may include a space for accommodating the coil 2200. The second accommodating unit 2320 may accommodate the coil 2200, and the second accommodating unit 2320 may be distinguished from the first accommodating unit 2310. For example, the first accommodating unit 2310 and the second accommodating unit 2320 may be arranged apart from each other and not connected to each other.

Therefore, the coil 220 and the driving indicator 2100 may be separated spatially.

In some embodiments, the coil 2200 may be accommodated in the second accommodating unit 2320 and surrounded by the base unit 2300. In another example, the coil 2200 may be surrounded by the base unit 2300 except for a region of the coil 2200 connected to an external power supply unit (not shown).

The base unit 2300 may include a driving groove 2350 and a locking hook 2360.

The driving groove 2350 may be formed to be connected to the first accommodating unit 2310. The protrusion 2150 of the driving indicator 2100 may correspond to the driving groove 2350.

For example, when the driving indicator 2100 is accommodated in the first accommodating unit 2310, the protrusion 2150 of the driving indicator 2100 may correspond to the driving groove 2350.

FIGS. 16 and 17 show that the driving groove 2350 has a shape penetrating through the side surface of the base unit 2300. Although not shown, the driving groove 2350 may be connected to the first accommodating unit 2310 and may not penetrate through the side surface of the base unit 2300. In other words, the driving groove 2350 may have a groove shape instead of a penetrating shape.

The driving groove 2350 may include a first region 2350A and a second region 2350B.

The first region 2350A may be arranged closer to the second accommodating unit 2320 than the second region 2350B.

The first region 2350A may be formed to support the protrusion 2150 when the driving indicator 2100, for example, the protrusion 2150 of the driving indicator 2100 is closest to the coil 2200.

To this end, the first region 2350A may have an edge surface similar to that of a side surface 2150A of the protrusion 2150 of the driving indicator 2100, and for example, the first region 2350A may have a curved surface.

Also, the first region 2350A may have an appropriate width to facilitate the movement of the driving indicator 2100 in the first direction, that is, the direction away from the coil 2200, and in the opposite direction. Also, the first region 2350A may be formed to extend in the first direction to be connected to the second region 2350B.

The second region 2350B is connected to the first region 2350A and may have a shape extending in the second direction crossing the first direction. As described above, the first direction is a direction in which the driving indicator 2100 moves away from the coil 2200 and is the Z-axis direction in FIGS. 16 and 17.

Also, in some embodiments, the second direction may be a direction orthogonal to the first direction, e.g., the X-axis direction in FIG. 16.

The second region 2350B may be formed to correspond to the protrusion 2150 when the driving indicator 2100 moves in the first direction and then moves in the second direction.

In other words, when the driving indicator 2100 is rotated, the protrusion 2150 may rise from the first region 2350A, be rotated by a predetermined angle, and arranged in the second region 2350B.

The second region 2350B may have a shape corresponding to a state in which the protrusion 2150 is arranged by being rotated, and may have, for example, a curved surface.

Also, the second region 2350B may have an appropriate width to facilitate the downward movement of the driving indicator 2100 in the direction opposite to the first direction, e.g., downward movement after being rotated, after the driving indicator 2100 returns in the second direction.

Also, the second region 2350B may have a shape similar to a state that the first region 2350A is rotated.

The base unit 2300 may include a locking hook 2360 to maintain the state after the driving indicator 2100 is arranged in the second region 2350B. In other words, a fixing portion 2150B of the protrusion 2150 of the driving indicator 2100 may be arranged on a top surface 2360A of the locking hook 2360 to fix the driving indicator 2100. In some embodiments, the top surface 2360A of the locking hook 2360 may have a flat surface.

In some embodiments, the base unit 2300 may have a separated region 2380 based on a boundary line 2370 in which the base unit 2300 overlaps the driving groove 2350. For example, when an edge of the separated region 2380 corresponds to the boundary line 2370 to separate the separated region 2380 from the rest of the base unit 2300, the driving groove 2350 may be open.

In an alternative embodiment, the driving indicator 2100 may arranged in the first accommodating unit 2310 before arranging the separated region 2380 in the remaining portion of the base unit 230 or combining the separated region 2380 with the remaining portion of the base unit 2300, the indicator 2100 may be easily arranged at the base unit 2300.

The operation of the information output apparatus 2000 of the present embodiment is similar to that of FIGS. 13A to 13D described above.

Briefly, it may be considered that the driving indicator 210 of FIG. 16 indicates the ON state. In other words, force may be applied by the coil 2200 to the driving indicator 2100 in the direction opposite to the first direction, that is, the downward force in the Z-axis direction of FIG. 16.

Also, in some embodiments, the driving indicator 2100 may be in a state in which the force in the direction opposite to the first direction is applied thereto and the force is removed. In other words, the protrusion 2150 of the driving indicator 2100 may be kept fixed by the driving groove 2350.

The fixing portion 2150B of the protrusion 2150 may maintain a state in which rotation thereof is restricted by the side surface 2360B of the locking hook 2360 of the base unit 2300.

Then, when the force in the first direction is applied to the driving indicator 2100 due to the generation of the magnetic field through the coil 2200, the driving indicator 2100 may move in the first direction, that is, the upward movement, and thus the driving indicator 2100 may be arranged to be further away from the coil 2200 as compared to the arrangement shown in FIG. 16.

The movement of the driving indicator 2100 may be caused by a magnetic field generated by a current flowing in the coil 120, and the driving indicator 2100 may move by receiving a repulsive force from the magnetic field generated around the coil 2200 according to the polarity of a magnetic material included in the driving indicator 2100, e.g., a permanent magnet.

At this time, the driving indicator 2100 may move while the protrusion 2150 of the driving indicator 2100 is connected to the driving groove 2350 of the base unit 2300.

In detail, the protrusion 2150 may rise in the first direction from the first region 2350A of the driving groove 2350 and reach a point at which the protrusion 2150 is unable to move further in the first direction due to the edge of the second region 2350B in the first region 2350A, that is, a highest point, and thus the driving indicator 2100 may also reach a highest point in the first direction.

Also, when the force in the first direction is continuously applied to the driving indicator 2100, the driving indicator 2100 may be rotated, and thus an end portion of the driving indicator 2100 in the first direction may face a second direction crossing the first direction instead of facing the first direction. In some embodiments, the driving indicator 2100 may face the X-axis direction of FIG. 16. To this end, a first accommodating unit 2310 having a size corresponding to the length of the driving indicator 2100 may be formed.

When force in the first direction is continuously transmitted to the driving indicator 2100 by the magnetic field due to the coil 2200 (i.e., when repulsive force is applied), the protrusion 2150 is arranged in the second region 2350B of the driving groove 2350 by the curved surface of the protrusion 2150 and the curved surface of the second region 2350B or the curved surfaces of the first region 2350A and the second region 2350A, thereby facilitating rotation of the driving indicator 2100. As a result, the rotation as described above may be performed.

In some embodiments, the driving indicator 1100 may be arranged to not to be past the top surface of the base unit 160 even when the driving indicator 2100 is rotated. In other words, the entire regions of the driving indicator 2100 may be accommodated in the first accommodating unit 2310 of the base unit 2600, and thus the driving indicator 2100 may not be past the first accommodating unit 2310.

Also, after the rotational movement, the protrusion 2150 of the driving indicator 2100 may be kept fixed by the locking hook 2360 without applying a separate force to the driving indicator 2100. In detail, the fixing portion 2150B of the protrusion 2150 may be arranged on the top surface 2360A of the locking hook 2360, and, since both the fixing portion 2150B and the top surface 2360A of the locking hook 2360 have flat surfaces, the protrusion 2150 may be fixed more stably.

Therefore, power for driving the driving indicator 2100 may be reduced, and, as a result, driving efficiency of the information output apparatus 2000 may be improved.

Then, when an attractive force to pull the driving indicator 2100 in the direction opposite to the first direction, is applied again, the driving indicator 2100 may rotate.

For example, when an attractive force is applied to the driving indicator 2100 to bring the driving indicator 2100 close to the coil 2200, the protrusion 2150 may be arranged in the first region 2350A through a curved surface of the side surface 2150A of the protrusion 2150 and a curved surface of the second region 2350B of the driving groove 2350 or curved surfaces of the first region 2350A and the second region 2350B, thereby facilitating rotation of the driving indicator 2100.

Then, even when the attraction is continuously applied or the attractive force is removed in some embodiments, the driving indicator 2100 may move in the direction opposite to the first direction, e.g., downward direction toward the coil 2200, and be again in the state same as that of FIG. 16.

Figure 18:
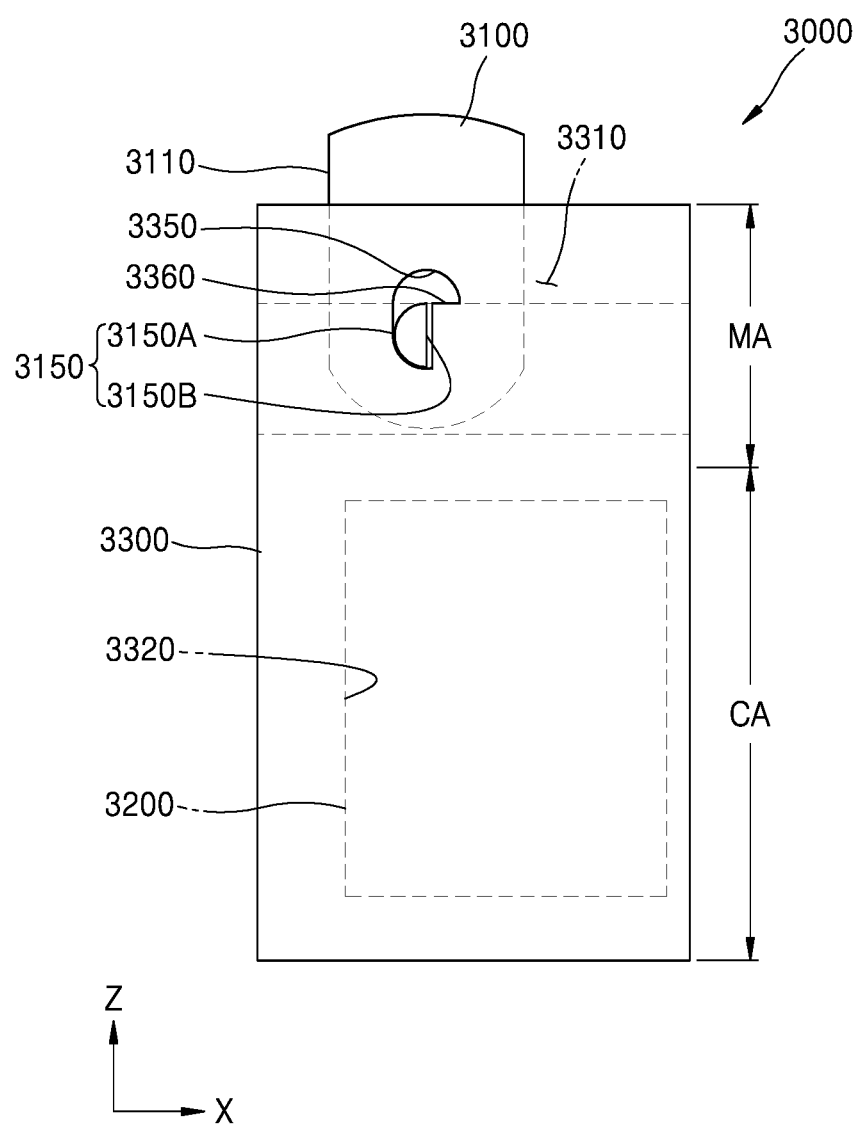
FIG. 18 is a schematic perspective front view of an information output apparatus according to another embodiment of the present disclosure.
Figure 19:
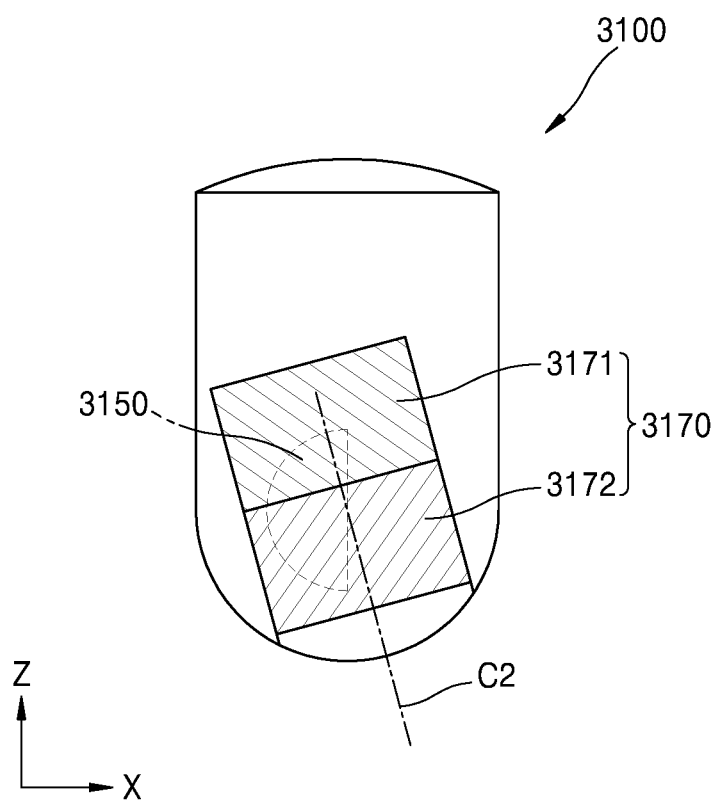
FIG. 19 is an enlarged view of a driving indicator of FIG. 18.

FIG. 18 is a schematic perspective front view of an information output apparatus according to another embodiment of the present disclosure, and FIG. 19 is an enlarged view of a driving indicator of FIG. 18.

An information output apparatus 3000 of the present embodiment includes at least one information output unit, and FIG. 18 shows one information output unit. In other words, the information output apparatus 3000 of FIG. 18 may be a single information output unit.

Although FIG. 18 shows the one information output unit, the information output apparatus 3000 may include two, three, or more information output units according to some embodiments. In other words, the information output apparatus 3000 may include various numbers of information output units according to purposes, characteristics of applied products, and user characteristics.

For convenience of explanation, an information output apparatus including one information output unit as shown in FIG. 18 will be described.

The information output apparatus 3000 may include a driving indicator 3100, a coil 3200, and a base unit 3300.

The driving indicator 3100 may be moved by a magnetic field generated by a current flowing in the coil 3200.

The driving indicator 3100 may include a material having magnetic properties.

Referring to FIG. 19, the driving indicator 3100 may include a magnetic portion 3170. According to some embodiments, the magnetic portion 3170 may include a magnetic material and may include, for example, a permanent magnet.

The magnetic portion 3170 may include a first magnetic portion 3171 and a second magnetic portion 3172. In detail, the first magnetic portion 3171 and the second magnetic portion 3172 may have different polarities from each other. For example, the first magnetic portion 3171 may have the N polarity, and the second magnetic portion 3172 may have the S polarity. In another example, the first magnetic portion 3171 may have the S polarity, and the second magnetic portion 3172 may have the N polarity.

The magnetic axis-wise direction C2 of the magnetic portion 3170 may be tilted at a predetermined angle with respect to the driving indicator 3100.

In some embodiments, the magnetic axis-wise direction C2 of the magnetic portion 3170 may not be parallel to the center axis of the driving indicator 3100.

In some embodiments, the center axis of the magnetic portion 3170 may be tilted to form a predetermined angle instead of being parallel to the lengthwise direction of the driving indicator 3100.

Due to the misalignment of the magnetic axis-wise direction C2 of the magnetic portion 3170 with the center axis of the driving indicator 3100, torque may be easily generated with respect to the driving indicator 3100, and the movement of the driving indicator 3100 may be smoothly controlled, thereby improving indication precision of the information output apparatus 3000 and reducing power consumption.

In FIG. 19, the magnetic portion 3170 may be arranged to overlap at least the center point of the driving indicator 3100 in the lengthwise direction of the driving indicator 3100.

In some embodiments, the magnetic portion 3170 may have a length extended to the center point of the driving indicator 3100 in the lengthwise direction.

Therefore, torque may be easily generated with respect to the driving indicator 3100 by changing the center of gravity of the driving indicator 3100.

Figure 20:
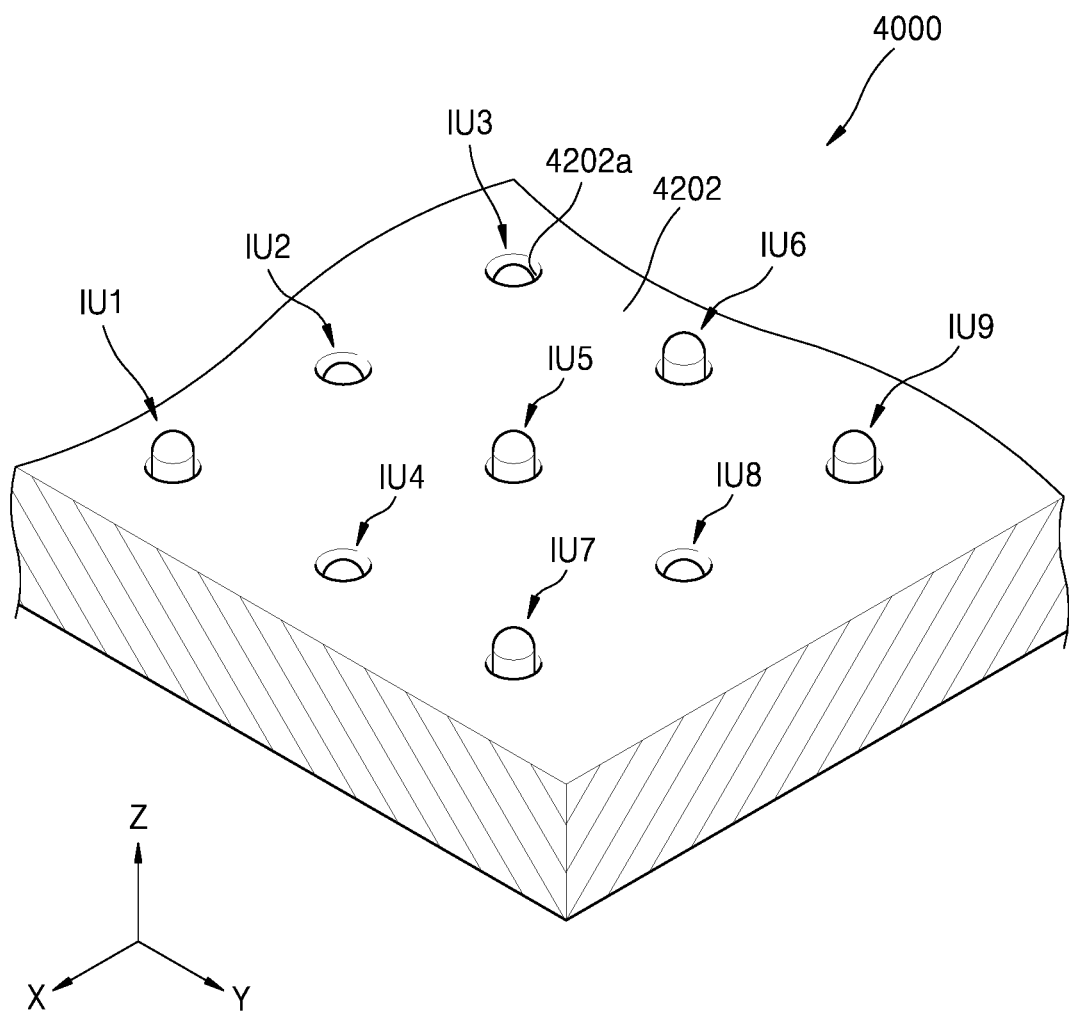
FIG. 20 is a schematic perspective view of an information output apparatus according to another embodiment of the present disclosure.

FIG. 20 is a schematic perspective view of an information output apparatus according to another embodiment of the present disclosure.

Referring to FIG. 20, an information output apparatus 4000 according to the present embodiment includes a plurality of information output units IU1, IU2, . . . , and IU9.

Although FIG. 20 shows nine information output units, the information output apparatus 4000 may include various numbers of information output units according to embodiments.

In other words, the information output apparatus 4000 may include various numbers of information output units according to purposes, characteristics of applied products, and user characteristics.

Meanwhile, the information output apparatus 4000 may include a housing 4202 to protect the plurality of information output units IU1, IU2, . . . , and IU9, and the housing 4202 may include via holes 4202a corresponding to respective information output units.

Since each information output unit may be selectively employed from among those of the above-described embodiments and modifications thereof, detailed descriptions thereof will be omitted.

When the base unit of the information output apparatus in the above-described embodiment is applied to the present embodiment, the base unit may have a long shape extended to correspond to at least a plurality of information output units. In another example, the base unit may be integrally formed to correspond to all of a plurality of information output units.

In detail, base units may be formed to include a plurality of first accommodating units and a second accommodating units for accommodating coils and driving indicators included in the respective information output units and to be connected to each other.

The information output apparatus according to the present embodiment may include one or more information output units, and driving indicators of the one or more information output unit may move at least in the first direction or the direction opposite thereto. Various information that may be sensed by a user may be output through the driving indicators.

For example, the information output apparatus according to the present exemplary embodiment may be a tactile sensing type information output apparatus that a user may recognize a protrusion of a driving indicator through a tactile sense. More particularly, information may be output in the form of Braille output.

In some embodiment, the information output apparatus may be a visually-sensing type information output apparatus that a user may visually recognize a protrusion of a driving indicator. Particularly, when a color is formed on one surface of the driving indicator, for example, the top surface, or when light is emitted from one surface of the driving indicator, the visual recognition effect may be increased.

Accordingly, the information output apparatus according to the present embodiment may output information to a user. In some embodiments, the information output apparatus according to the present embodiment may output various information to a user when the information output apparatus includes a plurality of information output units.

Also, in detail, a driving indicator may be easily moved in the first direction by a magnetic field generated by a coil (e.g., upward movement) and may be moved in the second direction by a protrusion and a driving groove of the driving indicator (e.g., clockwise rotation). Also, the rotation may be restricted as a fixing portion of the protrusion is supported by a locking hook of the driving groove. Therefore, a state in which protrusion of the driving indicator is low (e.g., an OFF state) may be easily maintained.

Then, when force is applied to the driving indicator in the direction opposite to the first direction, the driving indicator may be rotated by the protrusion and the driving groove of the driving indicator, e.g., rotation in the counterclockwise direction, and, even when the force is continuously applied or the force is removed, the driving indicator may move in the direction opposite to the first direction, e.g., moving downward. Also, further rotation may be restricted as a fixing portion of the protrusion is supported by a locking hook of the driving groove. Also, the protruding state (e.g., the ON state) of the driving indicator may be maintained.

Accordingly, the ON state and the OFF state of the driving indicator may be easily switched and maintained, power consumption for the movement of the driving indicator may be reduced, and the overall energy efficiency of an information output apparatus may be improved.

Also, the magnetic axis-wise direction of the magnetic field in the driving indicator of the present embodiment may not be parallel to the center axis of the driving indicator, thereby facilitating generation of torque with respect to the driving indicator and smoothly controlling the movement of the driving indicator to improve indication precision of the information output apparatus and reduce power consumption thereof.

For example, the magnetic body provided in the driving indicator of the present embodiment may be tilted at a predetermined angle with respect to the magnetic portion.

Also, in some other embodiments, the magnetic axis-wise direction of the magnetic portion included in the driving indicator may not be parallel to or may be tilted at a predetermined angle with respect to the center axis of the driving indicator.

Figure 21A:
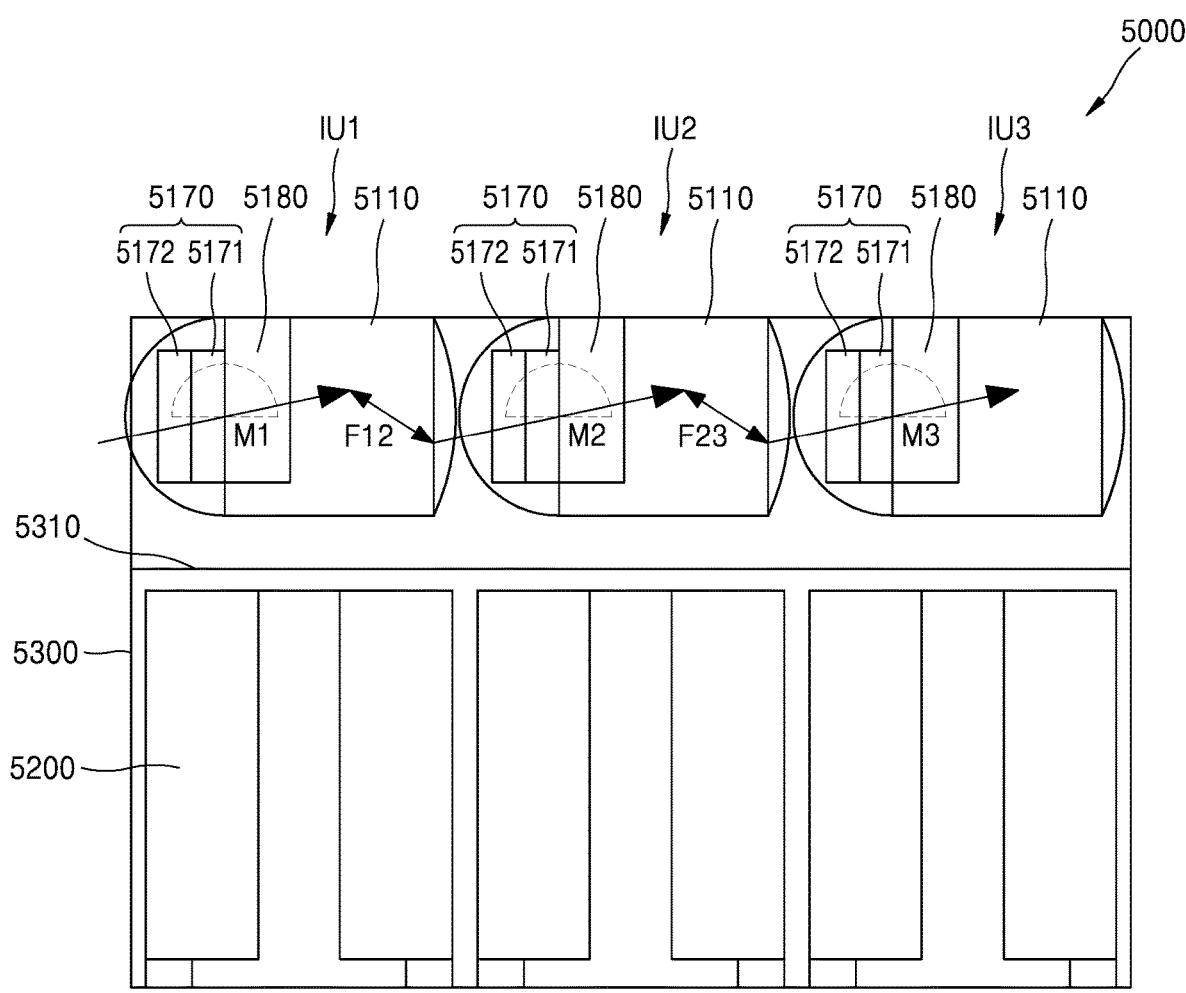
FIGS. 21A and 21B are schematic perspective views of an information output apparatus according to another embodiment of the present disclosure.
Figure 21B:
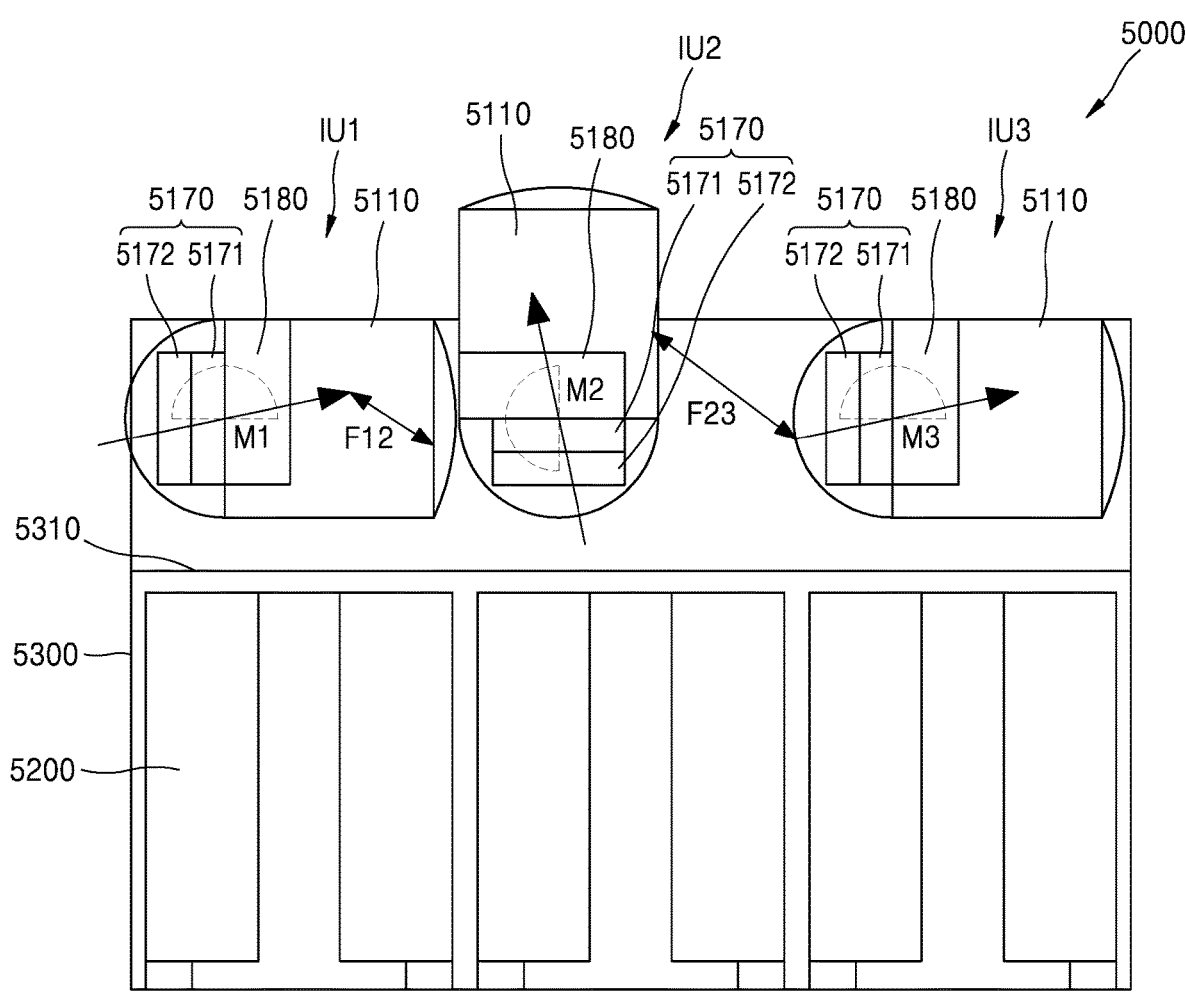

FIGS. 21A and 21B are schematic perspective views of an information output apparatus according to another embodiment of the present disclosure.

Referring to FIGS. 21A and 21B, an information output apparatus 5000 according to the present embodiment includes a plurality of information output units IU1, IU2, and IU3.

In detail, FIG. 21A shows that all information output units IU1, IU2 and IU3 are in the OFF state, and FIG. 21B shows that an information output unit IU2 is in the ON state and information output units IU1 and IU3 are in the OFF state.

Although FIGS. 21A and 21B show three information output units arranged in one direction, the information output apparatus 5000 may include various numbers of information output units according to embodiments. In other words, the information output apparatus 5000 may include various numbers of information output units according to purposes, characteristics of applied products, and user characteristics.

For example, four or more information output units may be arranged in one direction, and a plurality of information output units may be arranged in another direction crossing the above direction.

One of the information output apparatuses of the above-described embodiments may be selectively applied to each of the information output units IU1, IU2, and IU3. For example, one of the information output units IU1, IU2, and IU3 may include the configuration of the information output apparatus of FIG. 17.

In detail, each of the information output units IU1, IU2, and IU3 may include a driving indicator 5100, a coil 5200, and a base unit 5300.

In some embodiments, the base unit 5300 may extend to correspond to at least two or all of the information output units IU1, IU2, and IU3.

The driving indicator 5100 may be moved by a magnetic field generated by a current flowing in the coil 5200 and may have a protruding state by being rotated like, for example, the driving indicator 5100 of the information output unit IU2 (For example, the driving indicator 5100 of the information output unit IU2 may be rotated and protrude).

Also, the magnetic axis-wise direction of the magnetic field in the driving indicator 5100 of the present embodiment may not be parallel to the center axis of the driving indicator 5100, thereby facilitating generation of torque with respect to the driving indicator 5100 and smoothly controlling the movement of the driving indicator 5100 to improve the indication precision of the information output apparatus and to reduce power consumption.

In detail, the magnetic body 5180 may be tilted at a predetermined angle with respect to the magnetic portion 5170, for example. In some embodiments, the magnetic portion 5170 and the magnetic body 5180 may be arranged to be eccentric with each other. For example, the center axis of the magnetic portion 5170 and the center axis of the magnetic body 5180 may not be aligned with each other.

Therefore, the magnetic axis-wise directions of the magnetic fields in the driving indicator 5100 in the information output units as shown in FIG. 21A, and more particularly, magnetic axis-wise directions M1, M2, and M3 of magnetic fields of the magnetic axis 5170 and the magnetic body 5180 are tilted at predetermined angles with respect to the lengthwise direction of the driving indicator 5100 instead of being parallel thereto.

Also, attractive forces F12 and F23 between two information output units adjacent to each other from among the information output units are also tilted at predetermined angles with respect to the lengthwise direction of the driving indicator 5100 instead of being parallel thereto.

Also, FIG. 21B shows a state that the driving indicator 5100 of the information output unit IU2 is rotated. Here, a magnetic axis-wise direction of a magnetic field in the driving indicator 5100, e.g., a magnetic axis-wise direction M2 of magnetic fields the magnetic portion 5170 and the magnetic body of 5180 be tilted at a predetermined angle with respect to the center axis of the driving indicator 5100 or the lengthwise direction of the driving indicator 5100 instead of being parallel thereto. Therefore, the magnetic axis-wise direction M2 of magnetic fields the magnetic portion 5170 and the magnetic body of 5180 may be tilted at a predetermined angle with respect to the center axis of the coil 5200 instead of being parallel thereto.

Therefore, torque may be easily generated with respect to the driving indicator 5100. The driving indicator 5100 may be easily controlled and moved by driving the same through the coil 5200, thereby improving control characteristics of the information output apparatus 5000 and reducing power consumption thereof.

While the present disclosure has been described with reference to exemplary embodiments, it is to be understood that the present disclosure is not limited to the disclosed example embodiments, but, on the contrary, is intended to cover various modifications and equivalent arrangements included within the spirit and scope of the appended claims. Accordingly, the true scope of protection of the present disclosure should be determined by the technical idea of the appended claims.

Particular implementations described in the present disclosure are merely embodiments and do not limit the scope of the present disclosure in any way. For brevity of description, descriptions of conventional electronic configurations, control systems, software, and other functional aspects of the systems may be omitted. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Also, unless specifically mentioned as "essential", "important", components may not be necessary components for the application of the present disclosure.

In the specification (particularly in the claims) of the present disclosure, the use of the term "said" and similar indicating terminology may correspond to both the singular and the plural. Also, in the disclosure, when the range is described, it includes the disclosure to which the individual values belonging to the range are applied, and (if there is no description thereof) it is considered that each individual value constituting the range is described in the detailed description of the present disclosure. Finally, if there is no explicit order or contrary to the steps constituting the method according to the present disclosure, the steps may be carried out in a suitable order. The disclosure is not necessarily limited to the described order of the above steps. The use of all examples or exemplary terms (e.g., etc.) in the disclosure is merely for the purpose of describing the present disclosure in detail, and the scope of the present disclosure is not limited by the above examples or exemplary terms unless defined by the claims. Also, one of ordinary skill in the art appreciates that various modifications, combinations and changes can be made in accordance with design conditions and factors within the scope of the appended claims or their equivalents.

INDUSTRIAL APPLICABILITY

The information output apparatus according to the present embodiment may include one or more information output units, and driving indicators of the one or more information output unit may move at least in the first direction or the direction opposite thereto. Various information that may be sensed by a user may be output through the driving indicators.

For example, the information output apparatus according to the present exemplary embodiment may be a tactile sensing type information output apparatus that a user may recognize a protrusion of a driving indicator through a tactile sense. More particularly, information may be output in the form of Braille output.

In some embodiment, the information output apparatus may be a visually-sensing type information output apparatus that a user may visually recognize a protrusion of a driving indicator. Particularly, when a color is formed on one surface of the driving indicator, for example, the top surface, or when light is emitted from one surface of the driving indicator, the visual recognition effect may be increased.

Accordingly, the information output apparatus according to the present embodiment may output information to a user. In some embodiments, the information output apparatus according to the present embodiment may output various information to a user when the information output apparatus includes a plurality of information output units.

Also, in detail, a driving indicator may be easily moved in the first direction by a magnetic field generated by a coil (e.g., upward movement) and may be moved in the second direction by a protrusion and a driving groove of the driving indicator (e.g., clockwise rotation). Also, the rotation may be restricted as a fixing portion of the protrusion is supported by a locking hook of the driving groove. Therefore, a state in which protrusion of the driving indicator is low (e.g., an OFF state) may be easily maintained.

Then, when force is applied to the driving indicator in the direction opposite to the first direction, the driving indicator may be rotated by the protrusion and the driving groove of the driving indicator, e.g., rotation in the counterclockwise direction, and, even when the force is continuously applied or the force is removed, the driving indicator may move in the direction opposite to the first direction, e.g., moving downward. Also, further rotation may be restricted as a fixing portion of the protrusion is supported by a locking hook of the driving groove. Also, the protruding state (e.g., the ON state) of the driving indicator may be maintained.

Accordingly, the ON state and the OFF state of the driving indicator may be easily switched and maintained, power consumption for the movement of the driving indicator may be reduced, and the overall energy efficiency of an information output apparatus may be improved.

The invention claimed is:

1. An information output apparatus comprising one or more information output units,
    wherein each information output unit comprises:
    a coil arranged to be connected to a power source, such that a current flows in the coil;
    a base to accommodate the coil; and
    a driving indicator, which is arranged in the base to be apart from and close to the coil to be driven by a current flowing in the coil and is configured to move in a first direction toward the coil and a direction opposite thereto to rotate while being connected to the base and to move in a second direction crossing the first direction to be recognized by a user,
    wherein the base includes a partitioned space;
    wherein both the coil and the driving indicator are each arranged in the partitioned space in the base to spatially separate the coil and the driving indicator to prevent the coil from interfering with the driving indicator; and
    wherein the driving indicator comprises a first magnetic portion and a second magnetic portion having different polarities from each other.

2. The information output apparatus of claim 1, wherein the movement of the driving indicator in the second direction comprises a rotational movement.

3. The information output apparatus of claim 1, wherein the base comprises a first accommodator to accommodate the driving indicator and a second accommodator to accommodate the coil.

4. The information output apparatus of claim 3, wherein the first accommodator and the second accommodator of the base are arranged apart from each other.

5. The information output apparatus of claim 1, wherein:
    the driving indicator comprises a main body region and a protrusion protruding from a side surface of the main body region, and
    the movement of the driving indicator is controlled through the protrusion.

6. The information output apparatus of claim 5, wherein the protrusion comprises a curved surface.

7. The information output apparatus of claim 5, wherein the base comprises a driving groove corresponding to the protrusion of the driving indicator.

8. The information output apparatus of claim 7, wherein the driving groove comprises a curved surface.

9. The information output apparatus of claim 7, wherein the base comprises a locking hook for restricting the movement of the protrusion in the driving groove.

10. The information output apparatus of claim 1, wherein the one or more information output units comprises a plurality of information output units which are arranged to be apart from one another in one direction or another direction different therefrom.

11. An information output apparatus comprising one or more information output units,
    wherein each information output unit comprises:
    a coil arranged to be connected to a power source, such that a current flows in the coil;
    a base to accommodate the coil; and
    a driving indicator, which is arranged in the base to be apart from and close to the coil to be driven by a current flowing in the coil, is configured to move in a first direction toward the coil and a direction opposite thereto to rotate while being connected to the base and to move in a second direction crossing the first direction to be recognized by a user, and is configured to induce therein a magnetic field having a magnetic axis-wise direction eccentric in one direction,
    wherein the base includes a partitioned space;
    wherein both the coil and the driving indicator are each arranged in the partitioned space in the base to spatially separate the coil and the driving indicator to prevent the coil from interfering with the driving indicator; and
    wherein the driving indicator comprises a first magnetic portion and a second magnetic portion having different polarities from each other.

12. The information output apparatus of claim 11, wherein the driving indicator comprises a magnetic body adjacent to the magnetic portion.

13. The information output apparatus of claim 11, wherein the magnetic portion is tilted with the lengthwise direction of the driving indicator to have a magnetic axis-wise direction eccentric with the driving indicator.

14. The information output apparatus of claim 11, wherein the magnetic portion has a length extended to reach a center point of the driving indicator in the lengthwise direction.

15. The information output apparatus of claim 11, wherein the movement of the driving indicator in the second direction comprises a rotational movement.

16. The information output apparatus of claim 11, wherein:

the driving indicator comprises a main body region and a protrusion protruding from a side surface of the main body region, and the movement of the driving indicator is controlled through the protrusion.

17. The information output apparatus of claim 16, wherein the base comprises a driving groove corresponding to the protrusion of the driving indicator.

18. The information output apparatus of claim 11, wherein the one or more information output units comprises a plurality of information output units which are arranged to be apart from one another in one direction or another direction different therefrom.

* * * * *